(12) United States Patent
Noda et al.

(10) Patent No.: US 7,401,268 B2
(45) Date of Patent: Jul. 15, 2008

(54) INFORMATION RECORDING MEDIUM ON WHICH SECTOR DATA GENERATED FROM ECC BLOCK IS RECORDED, INFORMATION RECORDING APPARATUS FOR RECORDING SECTOR DATA, AND INFORMATION REPRODUCTION APPARATUS FOR REPRODUCING SECTOR DATA

(75) Inventors: Chosaku Noda, Kawasaki (JP); Hideo Ando, Hino (JP); Koichi Hirayama, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 191 days.

(21) Appl. No.: 11/500,961

(22) Filed: Aug. 9, 2006

(65) Prior Publication Data

US 2007/0011580 A1 Jan. 11, 2007

Related U.S. Application Data

(62) Division of application No. 11/434,058, filed on May 16, 2006, which is a division of application No. 11/227,133, filed on Sep. 16, 2005, now Pat. No. 7,134,055, which is a division of application No. 10/066,765, filed on Feb. 6, 2002, now Pat. No. 7,003,711.

(30) Foreign Application Priority Data

Feb. 7, 2001 (JP) .............................. 2001-031280

(51) Int. Cl.
 H03M 13/27 (2006.01)
 H03M 13/29 (2006.01)
(52) U.S. Cl. .................................................... 714/701

(58) Field of Classification Search ................. 714/701, 714/755
See application file for complete search history.

(56) References Cited

U.S. PATENT DOCUMENTS

| | | | |
|---|---|---|---|
| 5,517,484 A | 5/1996 | Takagi et al. | |
| 5,596,565 A | 1/1997 | Yonemitsu et al. | |
| 5,745,505 A | 4/1998 | Yonemitsu et al. | |
| 5,903,532 A | 5/1999 | Ikeda | |
| 6,064,639 A | 5/2000 | Sako et al. | |
| 6,175,686 B1 | 1/2001 | Noda | |
| 6,216,245 B1 | 4/2001 | Noda | |
| 6,373,803 B2 | 4/2002 | Ando et al. | |
| 6,378,100 B1 | 4/2002 | Van Dijk et al. | |
| 6,397,366 B1 | 5/2002 | Tanaka et al. | |
| 6,539,512 B1 | 3/2003 | Jeong et al. | |
| 6,661,754 B2 | 12/2003 | Kuroda | |
| 6,662,309 B2 | 12/2003 | Ando et al. | |
| 6,718,510 B2 | 4/2004 | Kojima | |
| 6,771,581 B2 * | 8/2004 | Fujimiya | 369/59.25 |

(Continued)

FOREIGN PATENT DOCUMENTS

JP 9-293331 11/1997

(Continued)

*Primary Examiner*—Stephen M. Baker
(74) *Attorney, Agent, or Firm*—Oblon, Spivak, McClelland, Maier & Neustadt, P.C.

(57) ABSTRACT

An information recording medium includes a management area where management information is recorded and a plurality of physical sector areas used to record a plurality of physical sector data blocks, which are generated by combining some data contained in a plurality of ECC blocks.

20 Claims, 20 Drawing Sheets

U.S. PATENT DOCUMENTS

| | | |
|---|---|---|
| 6,772,386 B2 | 8/2004 | Iwata et al. |
| 6,907,558 B2 * | 6/2005 | Suh .......................... 714/752 |
| 7,305,606 B2 * | 12/2007 | Hoshizawa et al. ......... 714/755 |

FOREIGN PATENT DOCUMENTS

| JP | 10-172243 | 6/1998 |
|---|---|---|
| JP | 2000-57700 | 2/2000 |
| JP | 2000-323995 | 11/2000 |
| JP | 2001-101806 | 4/2001 |
| JP | 2002-140868 | 5/2002 |
| JP | 2002-175666 | 6/2002 |

* cited by examiner

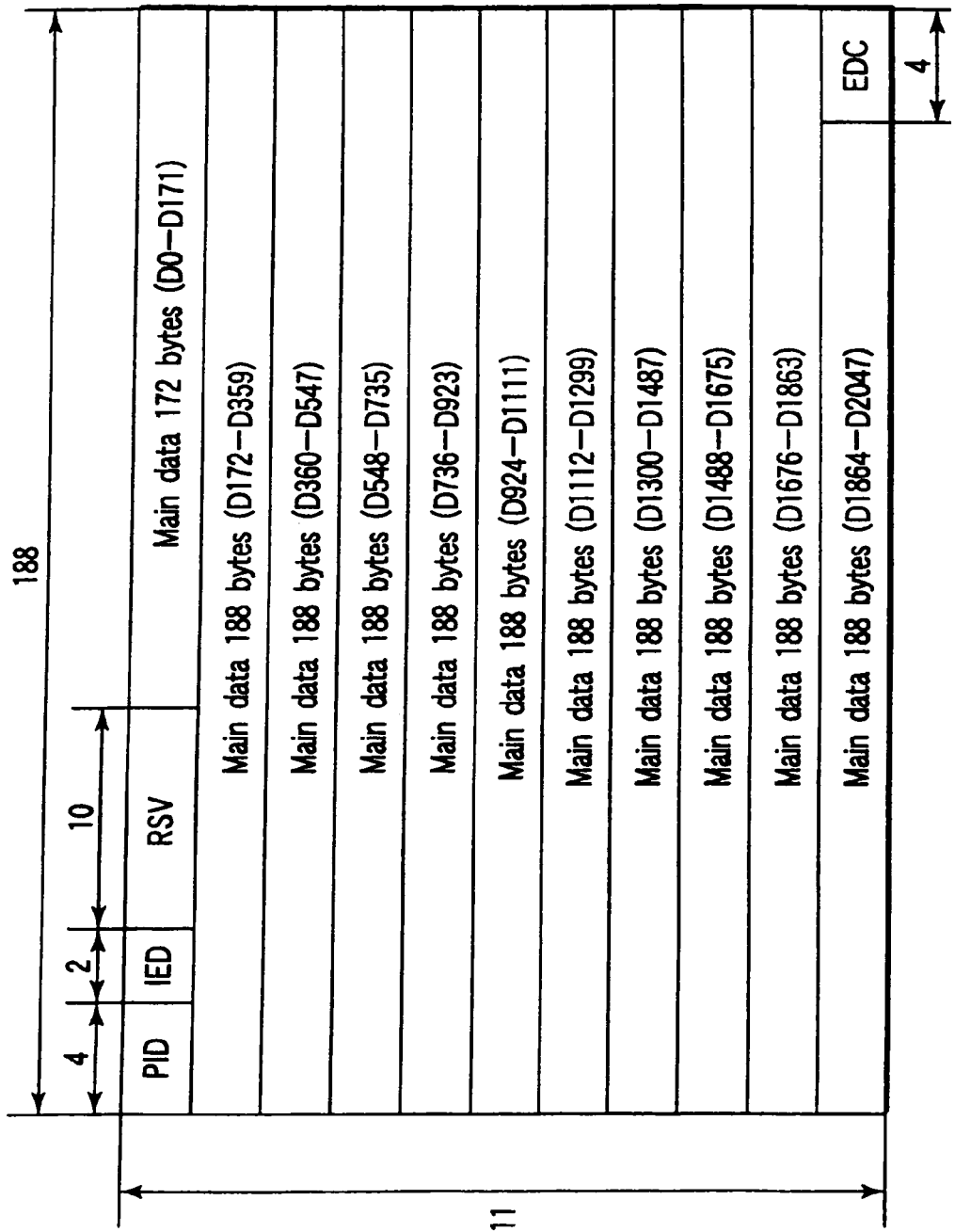
F I G. 8

● Type α
· Odd sector

| | |
|---|---|
| 1 | 7 |
| 2 | 8 |
| 3 | 9 |
| 4 | 10 |
| 5 | 11 |
| 6 | |

· Even sector

| | |
|---|---|
| | 6 |
| 1 | 7 |
| 2 | 8 |
| 3 | 9 |
| 4 | 10 |
| 5 | 11 |

● Type β
· Odd sector

| | |
|---|---|
| 1 | 2 |
| 3 | 4 |
| 5 | 6 |
| 7 | 8 |
| 9 | 10 |
| 11 | |

· Even sector

| | |
|---|---|
| | 2 |
| 1 | 4 |
| 3 | 6 |
| 5 | 8 |
| 7 | 10 |
| 9 | 11 |

FIG. 9

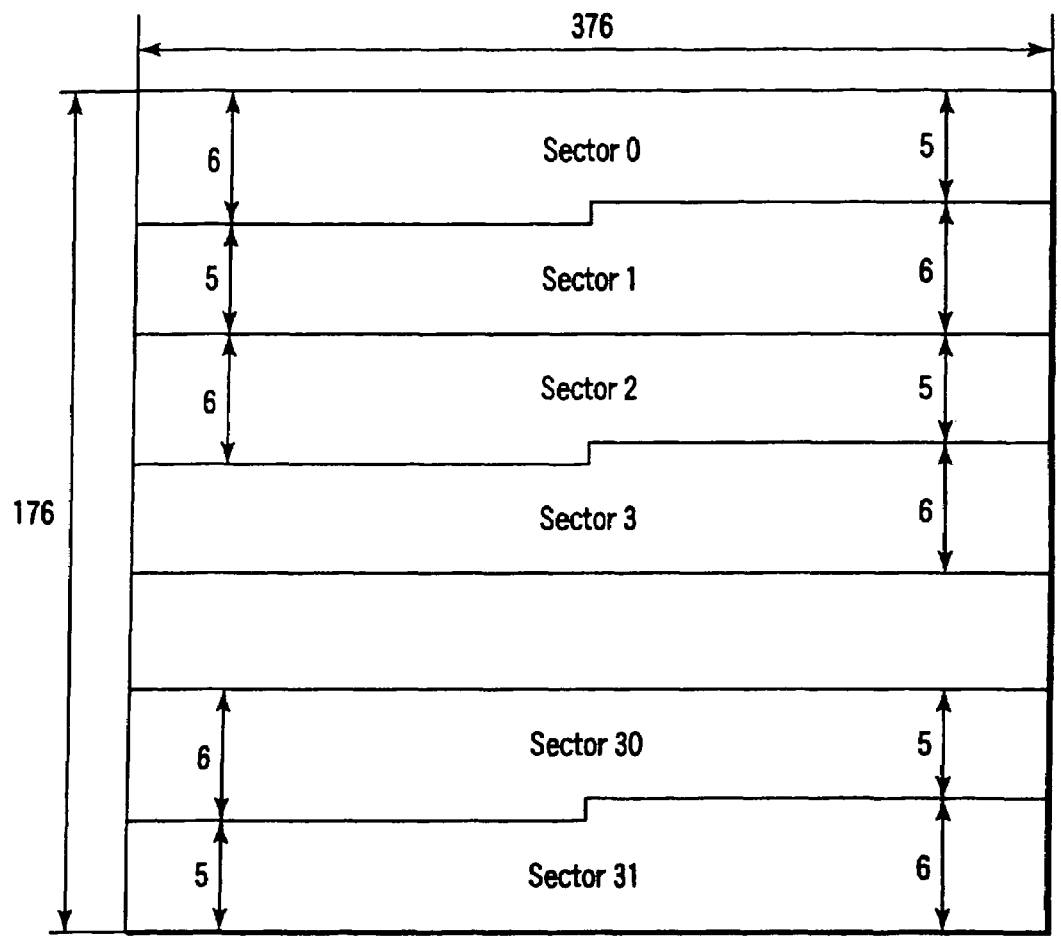
F I G. 10

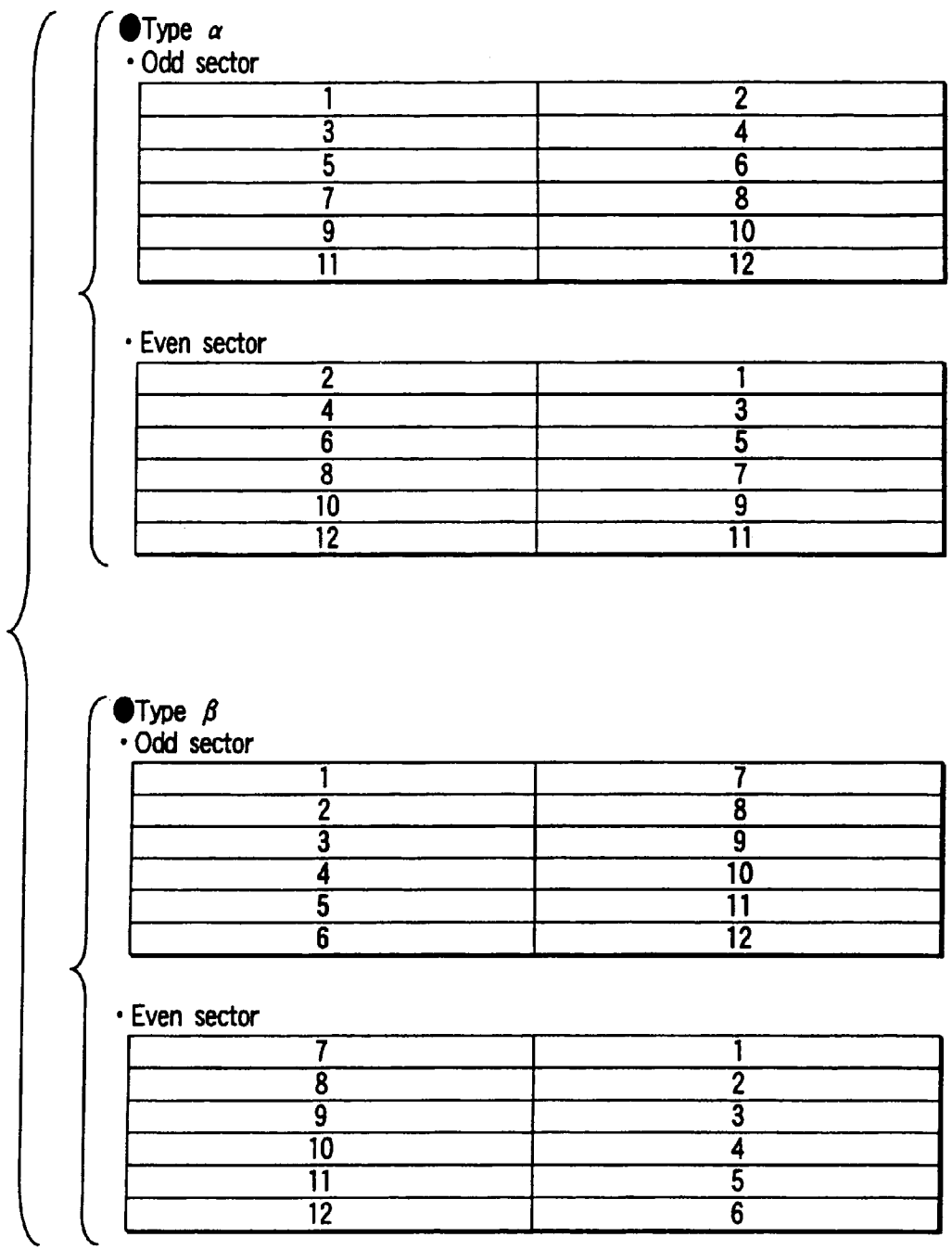
F I G. 17

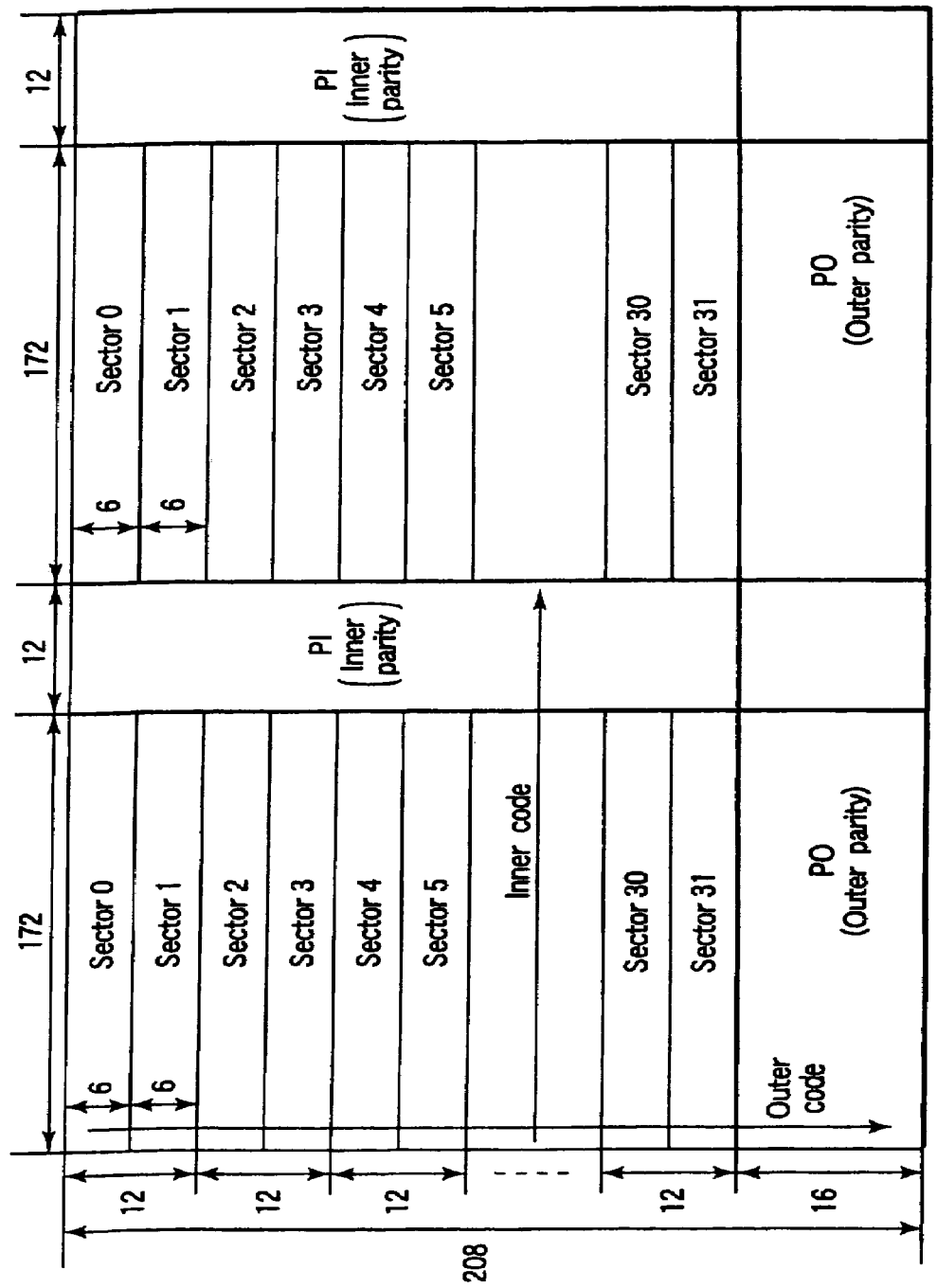
F I G. 19

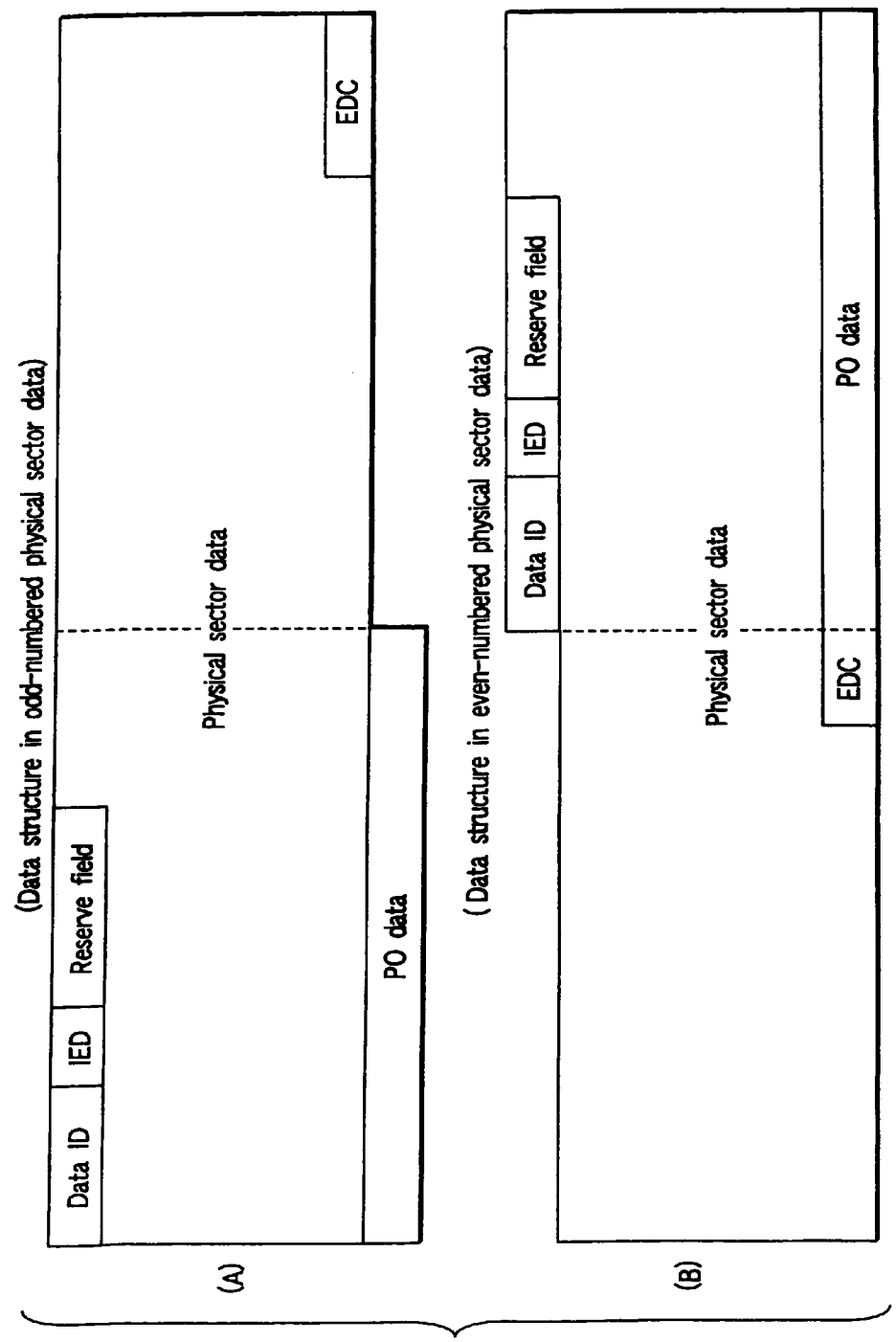
F I G. 20

INFORMATION RECORDING MEDIUM ON WHICH SECTOR DATA GENERATED FROM ECC BLOCK IS RECORDED, INFORMATION RECORDING APPARATUS FOR RECORDING SECTOR DATA, AND INFORMATION REPRODUCTION APPARATUS FOR REPRODUCING SECTOR DATA

CROSS-REFERENCE TO RELATED APPLICATIONS

This application is a division of and claims the benefit of priority under 35 U.S.C. § 120 from U.S. patent application Ser. No. 11/434,058, filed May 16, 2006, which is a division of U.S. patent application Ser. No. 11/227,133, filed Sep. 16, 2005, which is a division of U.S. patent application Ser. No. 10/066,765, filed Feb. 6, 2002, now U.S. Pat. No. 7,003,711, issued Feb. 21, 2006, and under 35 U.S.C. § 119 from Japanese Patent Application No. 2001-031280, filed Feb. 7, 2001, the entire contents of each of which are incorporated herein by reference.

BACKGROUND OF THE INVENTION

1. Field of the Invention

The present invention relates to an information recording medium on which sector data generated from an ECC (Error Correction Code) block structure is recorded. The present invention also relates to an information recording apparatus for recording sector data generated from the ECC block structure. Furthermore, the present invention relates to an information reproduction apparatus for reproducing information on a recording medium on which sector data generated from an ECC block structure is recorded.

2. Description of the Related Art

In recent years, the standards (physical and logical standards) for existing read-only and rewritable DVDs have been created. The standards describe an ECC block structure appended with parity codes for error correction as a data structure to be recorded on an optical disk (information recording medium). In existing DVDs, data having an ECC block structure common to both read-only and rewritable optical disks is recorded. Also, the application standards that describe the recording format in the application layer upon recording AV (Audio/Video) information or stream information on existing DVDs have been created.

In the physical standards, the minimum unit of user information to be recorded on an optical disk is 2048 bytes, and this recording unit is called a physical sector. Data in the physical sector include a data ID that records a sector number or the like, an error detection code IED (Data ID Error Detection code) for the data ID, user information, and an error detection code EDC (Error Detection Code) for data in the physical sector. As an error correction scheme for improving the reliability of data recorded on an optical disk, a "REED Solomon product code" scheme is adopted, and an ECC block structure appended with PI (inner-code parity) data and PO (outer-code parity) data is formed. One ECC block consists of data for 16 sectors. The technique that pertains to the ECC block structure is disclosed in Jpn. Pat. Appln. KOKAI Publication No. 10-172243.

In the present specifications, data contents or data structure including a data ID and parity data is called "data", and user information (=Main data) to be recorded is called "information". Also, data contents or information contents directly recorded in a physical sector on an optical disk are called "physical sector data" (=physical sector data block) or "physical sector information". One item of physical sector information has a size of 2048 bytes.

The logical standards define the data structure associated with user information to be recorded on an optical disk when viewed from the host computer side which is connected to an interface of an information reproduction or recording apparatus. The minimum unit to be exchanged between the host computer and information reproduction or recording apparatus is defined as a logical sector, and in the present specification, the contents of user information corresponding to the logical sector are called logical sector information. The logical sector information has a size of 2048 bytes in correspondence with that of the physical sector information.

The contents of the logical sector information basically match those of the physical sector information. However, since the physical layer defined in the physical standard and the logical layer defined in the logical standard are different layers, the contents of the physical sector information may be different from those of the logical sector information in practice. That is, the host computer and information reproduction or recording apparatus exchange information using 2048-byte logical sector information as a minimum unit, and information obtained by processing this logical sector information may be recorded as physical sector information on an optical disk.

The minimum unit of video object information or audio object information transferred between the host computer and information reproduction or recording apparatus is also 2048 bytes in correspondence with the logical sector size. According to the application standards, video object information and audio object information are broken up into 2048 bytes, and are multiplexed in the format of a pack structure as a minimum unit upon being recorded on an optical disk. That is, audio/video information to be recorded on a recording medium is segmented along the time axis, and video packs that store video object information and audio packs that store audio object information are distributed while being mixed. In this case, the video or audio pack information itself corresponds to the contents of the logical sector information.

The minimum unit of recording stream information is called an SOBU (Stream Object Unit), and one SOBU size is defined to be 32 logical sectors or 2 ECC blocks.

In existing DVDs, error correction can be made up to a maximum burst error length of 6 mm on an optical disk. In next-generation DVDs, the data bit length on an optical disk (recording medium) becomes small since the data recording density increases. Assume that the data bit length is proportional to the wavelength of light used in an optical head of the reproduction or recording/reproduction apparatus, and is inversely proportional to NA (Numerical Aperture). In this case, if the next-generation DVD has an optical wavelength of 405 nm and NA=0.85 compared to the existing DVD having an optical wavelength of 650 nm and NA=0.65, the error-correctable burst error length on an optical disk (recording medium) is considerably reduced to 2.9 mm.

$$6\times(405\div650)\times(0.65\div0.85)=2.9$$

Therefore, the next-generation DVD requires a technical means for assuring an error-correctable burst error length of 6 mm or more as in the current DVD.

When the correctable burst error length is greatly improved for the next-generation DVD while exploiting the REED Solomon product code technique as the ECC block structure, the following problems (1) to (2) are posed, and it is impossible to greatly improve the correctable burst error length by only changing the size of the REED Solomon product code of the existing DVD.

(1) The maximum size of a REED Solomon product code that corrects errors for respective unit bytes is limited to 256 rows×256 columns. In the existing DVD, the maximum size is 208 rows×182 columns. The existing DVD has an optimal structure within the limit range of 256 rows×256 columns, and it is difficult to greatly improve the correctable burst error length by merely changing the size.

(2) The main data information encoding efficiency cannot be greatly reduced compared to the existing DVD. It is possible to improve the correctable burst error length by increasing the PO size in an ECC block. But when this is done, redundancy which depends on the PO size increases and the main data information encoding efficiently drops considerably. The existing DVD has main data information encoding efficiency of 87% as well as redundant data such as a data ID and the like in the physical data. Hence, in the next-generation DVD, an encoding efficiency of around 87% needs to be assured.

(3) An appropriate physical data structure must be guaranteed. As a method of greatly improving the correctable burst error length and of assuring high main data information encoding efficiency, a method of largely increasing the PO size and reducing the PI size accordingly may be readily devised. However, in order to assure high-speed data access on an optical disk, the data ID must be arranged at the head in the physical sector data, and an interleaved arrangement of PO data in respective physical sectors is required for this purpose. However, to attain this, it becomes difficult to change the PO size to an arbitrary value.

BRIEF SUMMARY OF THE INVENTION

It is an object of the present invention to provide an information recording medium, information recording apparatus, and information reproduction apparatus which can solve the aforementioned problems.

In order to solve the aforementioned problems and to achieve the above object, an information recording medium, information recording apparatus, and information reproduction apparatus of the present invention have the following arrangements.

(1) An information recording medium of the present invention comprises a management area where management information is recorded, and a plurality of physical sector areas used to record a plurality of physical sector data blocks, which are generated by combining some data contained in a plurality of ECC blocks.

(2) An information recording apparatus of the present invention comprises generation section configured to generating a plurality of ECC blocks, and recording section configured to generating a plurality of physical sector data blocks by combining some data contained in the plurality of ECC blocks, and recording the plurality of physical sector data blocks on a plurality of physical sector areas on the information recording medium.

(3) An information reproduction apparatus of the present invention comprises read-out section configured to reading out the plurality of physical sector data blocks from the plurality of physical sector areas on the information recording medium, and reproduction section configured to reproducing data by generating the plurality of ECC blocks from the plurality of readout physical sector data blocks.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 shows the data structure of physical sector data generated from a plurality of ECC blocks, the relationship between physical sector information and logical sector information, and the like;

FIG. 4 shows the data structure of physical sector data generated from a single ECC block, the relationship between physical sector information and logical sector information, and the like;

FIG. 8 shows the data structure of sector data when one sector data is formed of an odd number of rows;

FIG. 9 shows an example of re-arrangement of sector data when one sector data is formed of an odd number of rows;

FIG. 10 shows the data structure of sector data when one sector data is formed of an odd number of rows;

FIG. 17 shows an example of re-arrangement of sector data when one sector data is formed of an even number of rows;

FIG. 19 shows a state wherein the sector block shown in FIG. 18 is horizontally segmented into two blocks, and inner and outer code parities are appended to the respective blocks; and FIG. 20 shows the data structure of physical sector data generated from an ECC block upon completion of row interleave shown in FIG. 15.

DETAILED DESCRIPTION OF THE INVENTION

Preferred embodiments of the present invention will now be described with reference to the accompanying drawings.

Basic features of the present invention are as follows.

1) Physical sector data to be recorded on an optical disk is segmented into small pieces, and segmented data is sequentially arranged (interleaved) in n (n is a positive value equal to or larger than 2) ECC blocks.

2) It is devised to always arrange the data ID at the head position of each physical sector data before or after the interleave process. As a result, even when access is made for respective physical sectors, address information can be quickly read out, and high-speed access can be attained.

This embodiment exemplifies a case of "n=2", but the contents of the present invention are not limited to this, and can be applied to a case of n=3 or n=4.

As a method of arranging one physical sector data in a plurality of ECC blocks, the present invention has proposed the following two methods.

Method 1: Physical sector information matches logical sector information. One physical sector data is segmented into rows including PI, the data for respective rows are respectively assigned to n (n≧2) ECC blocks, and the total of the number of rows including PI in one physical sector data and the number of PO rows is an integer multiple of n.

Method 2: All pieces of information in one logical sector are contained in a single ECC block. Logical sector data contained in different ECC blocks undergo an interleave process by alternately exchanging rows of these blocks for respective rows, and a data arrangement obtained as a result of that process is recorded on an optical disk as physical sector data.

Figure 1:
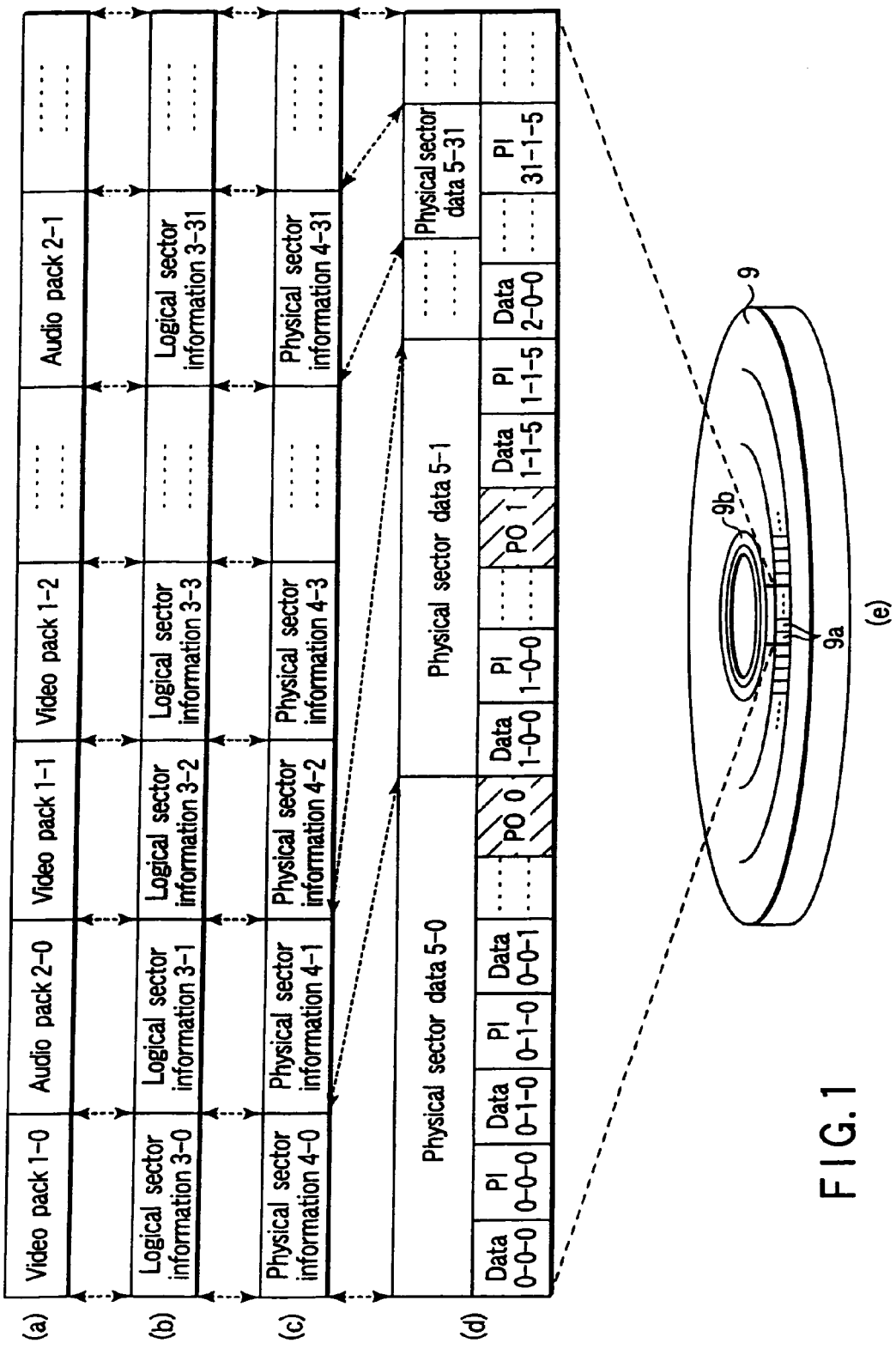

An outline of method 1 will be explained first using FIGS. 1 and 2.

An optical disk (information recording medium 9) has a physical sector area 9a and management area 9b. The management area 9b records management information. Data recorded in the physical sector area 9a will be described below. AV information or stream information, which is transferred continuously, is broken up into small pieces, which are converted into pack structures appended with pack headers, and these packs are recorded on a plurality of physical sector areas 9a assured on the optical disk. More specifically, as shown in (a) of FIG. 1, video information and audio information are transferred while being arranged along the time axis in the form of video packs 1-0 to 1-3, and audio packs 2-0 and 2-1. Each of the video packs 1-0 to 1-3 and audio packs 2-0 and 2-1 has a data size of 2048 bytes, matches the logical sector information size. The video packs 1-0 to 1-3 and audio packs 2-0 and 2-1 are abstractly handled as a plurality of pieces of logical sector information 3-0 to 3-31 in the logical layer, as shown in (b) of FIG. 1 (that is, examples of practical contents of the plurality of pieces of logical sector information 3-0 to 3-31 correspond to video packs 1-0 to 1-3 and audio packs 2-0 and 2-1). In method 1, since physical sector information and logical sector information match, these pieces of information are handled as a plurality of pieces of physical sector information 4-0 to 4-31, as shown in (c) of FIG. 1. As will be described in detail later, each item of physical sector information (4-0 to 4-31) has the following configuration. That is, 4-byte PID information, 2-byte IED information, and a 10-byte reserve field (the size in an existing DVD is 6 bytes) are arranged at the head of each information, and a 4-byte EDC is arranged at the end of information (data 0-0-0 to data 0-0-5). After that, that sequence is broken up into 188-byte data (each of the data 0-0-0 to data 0-0-5), error correction PI (inner-code parity) data (PI0-0-0 to PI0-0-5) is appended to every 188-byte data, and this data is arranged in turn, as shown in (d) of FIG. 1. In odd-numbered physical sector data (physical sector data 5-0), PO (outer-code parity) data (PO0) is arranged at the end of data to complete physical sector data 5.0. The present invention is characterized in that even-numbered physical sector data (physical sector data 5-1) has a structure in which PO data (PO) is arranged in the second column from the end of data, and data 1-1-5 and PI data (PI1-1-5) are arranged at the end of the even-numbered physical sector data (as will be described in detail later). Physical sector data 5-0 to 5-31, which is completed in this manner, is recorded on the physical sector areas 9a on the optical disk (information recording medium 9) in accordance with the order it is arranged, as shown in (e) of FIG. 1. One physical sector data item is recorded on one physical sector area 9a.

Figure 2:
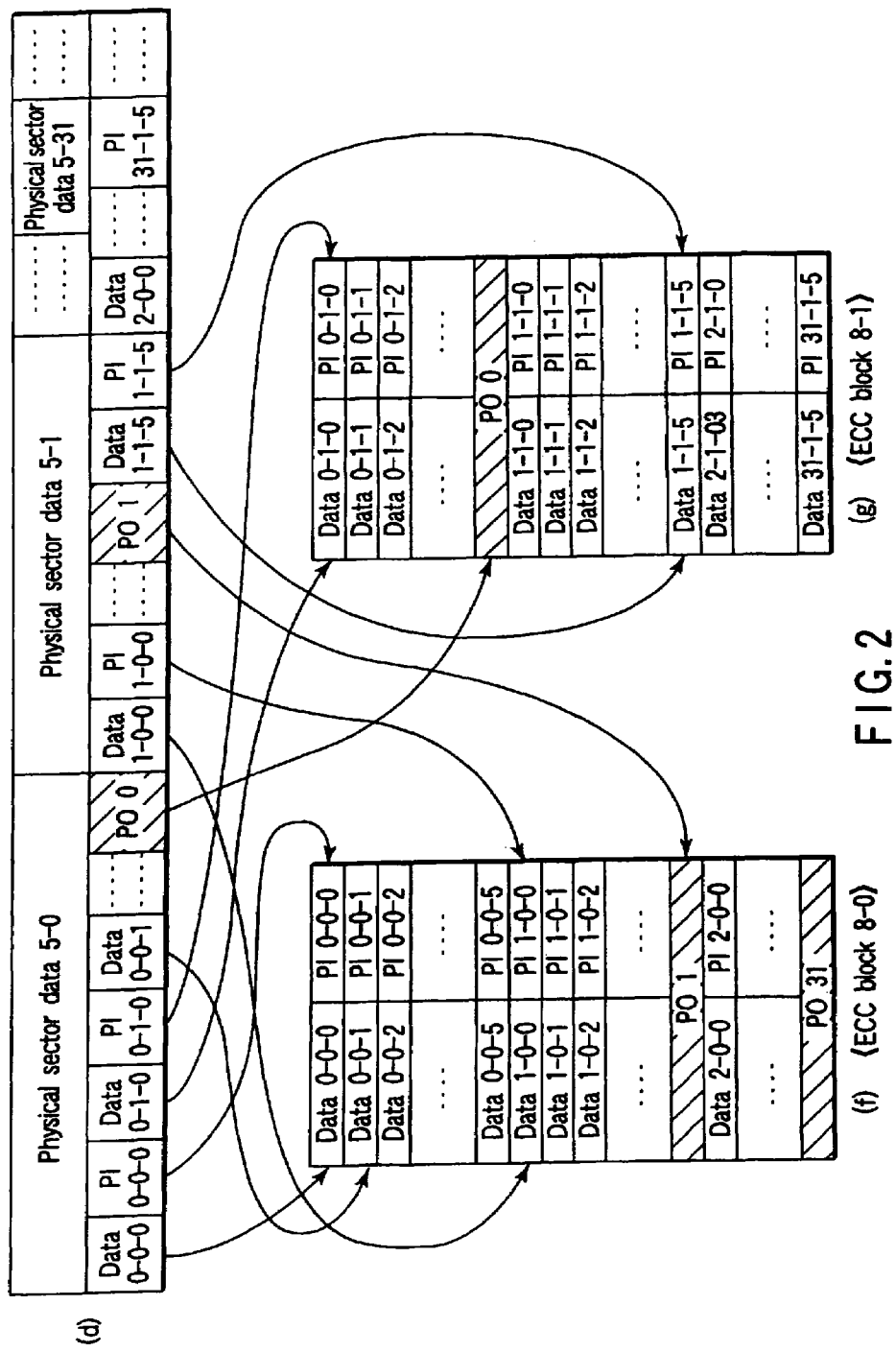
FIG. 2 shows the data structure of physical sector data recorded on an information recording medium, and the relationship between a plurality of physical sector data and a plurality of (two) corresponding ECC blocks.

As shown in (f) and (g) of FIG. 2, one physical sector data 5-0 item is formed as a combination of data in two different ECC blocks 8-0 and 8-1. More specifically, data in the physical sector data 5-0 is finely broken up into 200-byte data, and 188-byte data 0-0-0 and PI data 0-0-0 are arranged in the first row in the ECC block 8-0. Next 188-byte data 0-1-0 and PI 0-1-0 in the physical sector data 5-0 are arranged in the first row in the ECC block 8-1. Furthermore, the next 188-byte data 0-0-1 and PI data 0-0-1 are arranged in the second row in the ECC block 8-0. Of PO data in the ECC block 8-1, the first 200 bytes are inserted in the sixth row in the ECC block 8-1 as PO0. As a result, data from data 0-0-0 to PO0 form the physical sector data 5-0.

First data 1-0-0 and PI 1-0-0 that follow the first data in the next physical sector data 5-1 are arranged in the seventh row in the ECC block 8-0, as shown in (f) of FIG. 2. Of PO data in the ECC block 8-0, the first 200-byte data is arranged as PO1 in the 12th row in the ECC block 8-0. In this way, PO data (PO0, PO1) for respective rows (200 bytes) is arranged at equal intervals for the respective physical sector data 5-0 to 5-31, and the arrangement positions have a difference of one physical sector data between a pair of ECC blocks 8-0 and 8-1.

The detailed structure in the ECC blocks 8-0 and 8-1 shown in (f) and (g) of FIG. 2 will be explained below with reference to FIG. 3.

Figure 3:
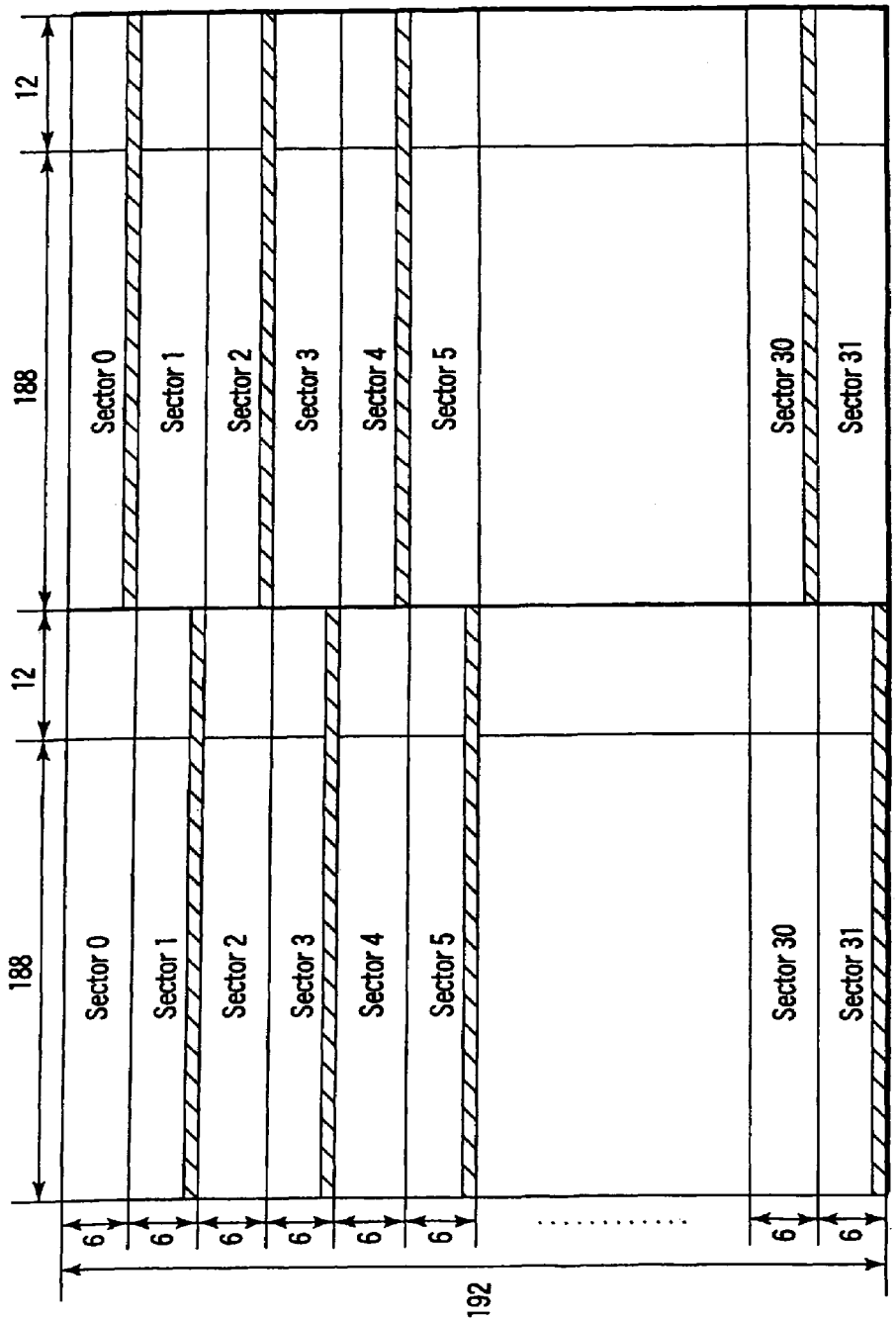
FIG. 3 shows the data structure of an ECC block upon completion of row interleave when one sector data consists of an odd number of rows.

FIG. 3 shows a combined state of two, right and left (for each 200-byte column) ECC blocks. Each ECC block has a structure in which 12-byte PI data is appended every 188 bytes, and PO data for 16 rows is appended. The PO data for 16 rows is decomposed into row data item, each of which is interleaved and inserted at every 12-row positions. The hatched portion of 200-byte columns per row in FIG. 3 means interleaved and inserted PO data.

The user information size assigned per sector is 2048 bytes as in an existing DVD, and information having the same contents as those of logical sector information recognized in the application layer is set as each item of physical sector information (main data). Four-byte data ID information, 2-byte IED information, and a 10-byte reserve field (the size in an existing DVD is 6 bytes) are arranged at the head of 2048 bytes of the physical sector information, and 4-byte EDC data is arranged at the end of the physical sector information, thus forming all the data of a physical sector.

Since one physical sector data is interleaved across two small ECC blocks, an error-correctable burst error length can be improved to nearly twice that of the prior art. That is, one item of physical sector data is broken up into 188-byte data items, each of which forms one row data by appending 12-byte PI data (since the existing PI size is 10 bytes, and is increased to 12 bytes, error correction performance per row can be improved), and this row data is alternately and sequentially arranged in right and left different ECC blocks. This embodiment is characterized in that data (data sector) in one physical sector has an odd number of rows, i.e., 11 rows, as shown in FIG. 3. Since the data sector is made up of an odd number of rows, the total number of rows can be even upon inserting one PO row in each physical sector, and the PO row can be properly inserted in two ECC blocks without forming an odd row.

PID information is always arranged at the head position (upper left corner position in FIG. 3) of each physical sector, and the PO insert positions are devised to allow efficient interleave insertion of PO data, as shown in FIG. 3. That is, PO data is arranged at the last row position of an even sector, and PO data is arranged at the second row position from the end of the sector in an odd sector. As a result, PO data is arranged in a single ECC block, and all physical sectors can have the same data size.

An outline of method 2 will be explained below using FIGS. 4 and 5.

Figure 4:
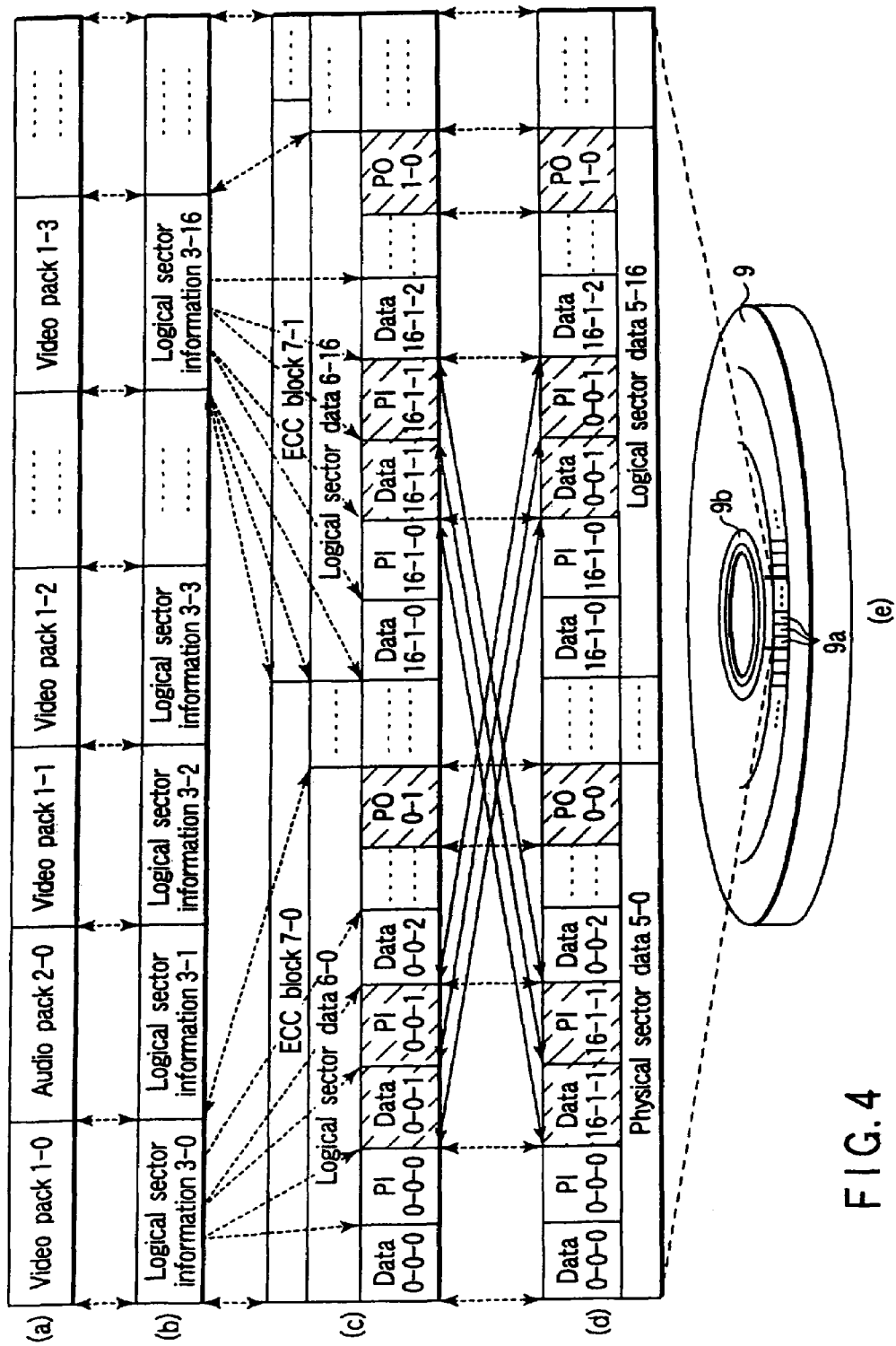
Figure 5:
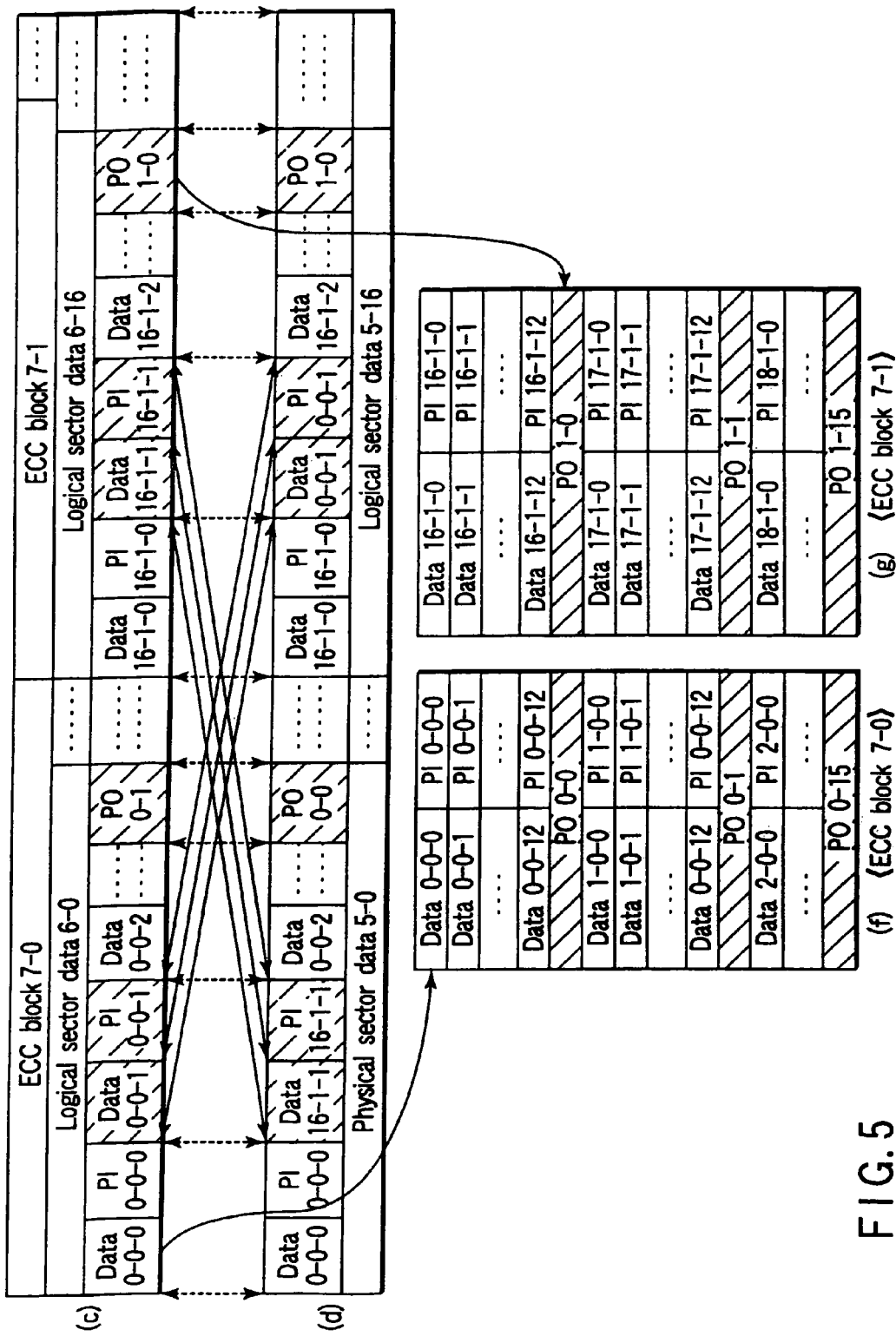
FIG. 5 shows the data structure of physical sector data recorded on an information recording medium, and the relationship between a plurality of physical sector data and a single corresponding ECC block.

As in method 1, AV information or stream information is stored in the form of packs 1-0 to 1-3 and 2-0, as shown in (a) of FIG. 4, and the information contents of the packs 1-0 to 1-3 and 2-0 correspond to a plurality of pieces of logical sector information 3-0 to 3-16. For the plurality of pieces of logical sector information 3-0 to 3-16 obtained at that time, ECC blocks 7-0 and 7-1 are formed and PI information (PI0-0-0 to PI16-1-1) and PO information (PO0-0, PO1-0) are inserted by the same method as in the conventional DVD standards ((c) of FIG. 4).

A large characteristic feature of the present invention lies in that processes from the state in (b) of FIG. 4 until (c) of FIG. 4, i.e., appending of data ID information, IED information, a reserve field, and EDC information and an insert process of PI information (PI0-0-0 to PI16-1-1) and PO information (PO0-0, PO1-0) are the same as in those of the conventional DVD (the numbers of data byes are also the same). Therefore, the structures in the ECC blocks 7-0 and 7-1 shown in (f) and (g) of FIG. 5 perfectly match the conventional DVD standards as well as the values of various numbers of data byes. As a result, some of the ECC block generation process (generation of PI and PO, and the like) and error correction process in a reproduction apparatus or recording/reproduction apparatus having compatible functions between the existing DVD and next-generation DVD can be used in common to those upon using an existing DVD disk (medium), and the processing routines and circuits of the reproduction apparatus or recording/reproduction apparatus having compatible functions between the existing DVD and next-generation DVD can be simplified.

In order to improve an error-correctable burst error length by interleaving data in physical sector data 5-0 and 5-16 between the two ECC blocks 7-0 and 7-1, method 2 of the present invention executes an exchange process between data rows and PI rows (data 0-0-1 and PI0-0-1, and data 16-1-1 and PI16-1-1) located at the even-numbered row positions of logical sector data at identical positions (having the same row numbers) in the neighboring ECC blocks 7-0 and 7-1, as shown in (d) of FIG. 4. Data ID information that contains sector address information is arranged in the first row in each logical sector data. Hence, when only an exchange process between data rows and PI rows at the even-numbered row positions is done, and an exchange process between data rows and PI rows at odd-numbered row positions is inhibited, arrangement of the data ID information that contains sector address information at the head positions in the physical sector data 5-0 and 5-16 shown in (d) of FIG. 4 is guaranteed. Each of the logical sector data items 6-0 and 6-16 always includes 12 rows (an even number of rows) of data and PI rows. Hence, by exchanging data and PI rows at the even-numbered row positions in the logical sector data items 6-0 and 6-16 according to the aforementioned rules, the positions of PO information (PO0-0, PO1-0) in the logical sector data items 6-0 and 6-1 and ECC blocks 7-0 and 7-1 remain unchanged without being exchanged. For this reason, the appending process of PO information and error correction process are facilitated. The physical sector data items 5-0 and 5-16 generated in this way are recorded on the physical sector areas 9a on an optical disk (information recording medium 9) in accordance with the order data in the physical sector data items 5-0 and 5-16 are arranged. One physical sector data is recorded on one physical sector area 9a.

An example of an information recording/reproduction apparatus (information recording apparatus or information reproduction apparatus) will be explained below using FIG. 6.

1. Function of Information Recording/Reproduction Apparatus 1-1. Basic Function of Information Recording/Reproduction Apparatus An information recording/reproduction apparatus executes the following processes. That is, the apparatus records new information or rewrites (or erases) information at a predetermined position on the information recording medium 9 using a focused beam spot; and the apparatus reproduces already recorded information from a predetermined position on the information recording medium 9 using a focused beam spot.

1-1-1. Basic Function Achieving Means of Information Recording/Reproduction Apparatus As means for achieving the above basic functions, the information recording/reproduction apparatus executes the following processes. That is, the apparatus traces a focused beam spot along tracks (not shown) on the information recording medium 9;

the apparatus switches recording/reproduction/erasure of information by changing the amount of light of a focused beam spot with which the information recording medium 9 is irradiated; and the apparatus converts an externally input recording signal d into an optimal signal to record it at high density and with a low error rate.

2. Structure of Mechanism Portion and Operation of Detection Portion 2-1. Basic Structure of Optical Head 202 and Signal Detection Circuit 2-1-1. Signal Detection by Optical Head 202

The optical head 202 basically comprises a semiconductor laser element as a light source, a photodetector, and an objective lens. A laser beam emitted by the semiconductor laser element is focused on the information recording medium 9 via the objective lens. The laser beam reflected by a light reflection film or light reflective recording film of the information recording medium 9 is photoelectrically converted by the photodetector. A detection current obtained by the photodetector undergoes current-voltage conversion by an amplifier 213 to obtain a detection signal. This detection signal is processed by a focusing/tracking error detection circuit 217 or binarization circuit 212. In general, the photodetector is divided into a plurality of photodetection regions, which individually detect changes in the amount of light with which the respective photodetection regions are irradiated. Respective detection signals undergo sum/difference calculations by the focusing/tracking error detection circuit 217, thus detecting focusing and tracking errors. In this way, a change in the amount of light reflected by the light reflection film or light reflective recording film of the information recording medium 9 is detected, thereby reproducing a signal on the information recording medium 9.

2-1-2. Objective Lens Actuator Structure

The objective lens that focuses a laser beam emitted by the semiconductor laser element on the information recording medium 9 is movable in two axis directions in accordance with an output current from an objective lens actuator driving circuit 218. The objective lens moves:

in a direction perpendicular to the information recording medium 9 to correct focusing errors; and in the radial direction of the information recording medium 9 to correct tracking errors.

Such an objective lens moving mechanism is called an objective lens actuator (not shown).

2-2. Rotation Control System of Information Recording Medium 9

The information recording medium 9 is mounted on a rotary table 221 which is rotated by the driving force of a spindle motor 204. The rotational speed of the information recording medium 9 is detected based on a reproduction signal obtained from the information recording medium 9. That is, the detection signal (analog signal) output from the amplifier 213 is converted into a digital signal by the binarization circuit 212, and a PLL circuit 211 generates a constant period signal (reference clock signal) based on that digital signal. An information recording medium rotational speed detection circuit 214 detects the rotational speed of the information recording medium 9 using this signal, and outputs the detection value.

A correspondence table of the information recording medium rotational speed which corresponds to the radial position where data is reproduced or recorded/erased on the information recording medium 9 is pre-stored in a semiconductor memory 219. When a reproduction position or recording/erasure position is determined, a controller 220 sets a target rotational speed of the information recording medium 9 by looking up information recorded in the semiconductor memory 219, and sends that value to a spindle motor driving circuit 215.

The spindle motor driving circuit 215 calculates the difference between this target rotational speed and the output signal (current rotational speed) of the information recording medium rotational speed detection circuit 214, and supplies the driving current corresponding to that difference to the spindle motor 204, thus controlling the rotational speed of the spindle motor 204 to be constant. The output signal from the information recording medium rotational speed detection circuit 214 is a pulse signal having a frequency corresponding to the rotational speed of the information recording medium 9, and the spindle motor driving circuit 215 controls both the frequency and pulse phase of this signal.

2-3. Optical Head Moving Mechanism

To move the optical head 202 in the radial direction of the information recording medium 9, an optical head moving mechanism (feed motor) 203 is provided.

3. Functions of Respective Control Circuits 3-1. Focused Beam Spot Trace Control In order to perform focusing or tracking error correction, a circuit for supplying a driving current to the objective lens actuator in the optical head 202 in accordance with the output signal (detection signal) from the focusing/tracking error detection circuit 217 is the objective lens actuator driving circuit 218. This circuit 218 includes a phase compensation circuit for improving characteristics in correspondence with the frequency characteristics of the objective lens actuator to attain quick response of objective lens movement up to the high-frequency range.

In response to a command from the controller 220, the objective lens actuator driving circuit 218 executes:

an ON/OFF process of focusing/tracking error correction operation (focus/track loop);

a process for moving the objective lens at low speed in a direction (focus direction) perpendicular to the information recording medium 9 (executed when focus/track loop is OFF); and a process for moving a focused beam spot to a neighboring track by slightly moving in the radial direction (direction to cross tracks) of the information recording medium 9 using a kick pulse.

4. Various Operations Associated with Control System of Mechanism Portion 4-1. Startup Control When the information recording medium 9 is mounted on the rotary table 221 and startup control is started, the processes are executed in accordance with the following sequence.

1) The controller 220 sends a target rotational speed to the spindle motor driving circuit 215, which supplies a driving current to the spindle motor 204, thus starting rotation of the spindle motor 204.

2) At the same time, the controller 220 issues a command (execution command) to the feed motor driving circuit 216, which supplies a driving current to the optical head driving mechanism (feed motor) 203, thus moving the optical head 202 to the innermost peripheral position of the information recording medium 9. It is confirmed if the optical head 202 has reached an inner peripheral portion beyond the information recording region on the information recording medium 9.

3) When the spindle motor 204 has reached the target rotational speed, that status (status report) is output to the controller 220.

4) A semiconductor laser driving circuit 205 supplies a current to the semiconductor laser element in the optical head 202 in correspondence with a reproduction light amount signal sent from the controller 220 to a recording/reproduction/erasure control waveform generation circuit 206, thus starting laser emission.

Note that an optimal irradiation light amount upon reproduction varies depending on the types of information recording media 9. Upon startup, the lowest irradiation light amount value of those values is set.

5) The objective lens actuator driving circuit 218 controls to move the objective lens (not shown) in the optical head 202 to a position farthest from the information recording medium 9, and make the objective lens slowly approach the information recording medium 9 in accordance with a command from the controller 220.

6) At the same time, the focusing/tracking error detection circuit 217 monitors a focusing error amount, and outputs status to the controller 220 when the objective lens has approached an in-focus position.

7) Upon receiving that status, the controller 220 issues a command to the objective lens actuator driving circuit 218 to enable the focus loop.

8) The controller 220 issues a command to the feed motor driving circuit 216 while the focus loop is ON to slowly move the optical head 202 toward the outer periphery of the information recording medium 9.

9) At the same time, a reproduction signal from the optical head 202 is monitored. When the optical head 202 has reached the recording region on the information recording medium 9, the controller 220 stops movement of the optical head 202, and issues a command to the objective lens actuator driving circuit 218 to enable the track loop.

10) An "optimal light amount upon reproduction" and "optimal light amount upon recording/erasure" recorded on the inner peripheral portion of the information recording medium 9 are reproduced, and are recorded in the semiconductor memory 219 via the controller 220.

11) Furthermore, the controller 220 sends a signal corresponding to that "optimal light amount upon reproduction" to the recording/reproduction/erasure control waveform generation circuit 206, thus re-setting the emission amount of the semiconductor laser element upon reproduction.

12) The emission amount of the semiconductor laser element upon recording/erasure is set in correspondence with the "optimal light amount upon recording/erasure" recorded on the information recording medium 9.

4-2. Access Control 4-2-1. Reproduction of Access Destination Information on Information Recording Medium 9

Information that indicates the locations and contents of information recorded on the information recording medium 9 varies depending on the types of information recording medium 9, and is generally recorded in directory management regions, navigation packs, or the like in the information recording medium 9. Note that the directory management regions are recorded together in the inner or outer peripheral region of the information recording medium 9. On the other hand, the navigation pack is contained in a VOBS (Video Object Set) complying with the data structure of a PS (Program Stream) of MPEG2, and records information indicating the location of the next video data.

When specific information is to be reproduced or recorded/erased, information in the above-mentioned region is reproduced, and an access destination is determined based on the reproduced information.

4-2-2. Coarse Access Control

The controller 220 calculates the radial position of the access destination, and detects the distance between that position and the current position of the optical head 202. As for the moving distance of the optical head 202, velocity curve information that allows the head to reach the target position within a shortest period of time is stored in advance in the semiconductor memory 219. The controller 220 reads that information, and controls movement of the optical head 202 by the following method in accordance with the velocity curve. The controller 220 issues a command to the objective lens actuator driving circuit 218 to disable the track loop, and then controls the feed motor driving circuit 216 to start movement of the optical head 202. When the focused beam spot has crossed a track on the information recording medium 9, the focusing/tracking error detection circuit 217 generates a tracking error detection signal. Using this tracking error detection signal, the relative velocity of the focused beam spot with respect to the information recording medium 9 can be detected. The feed motor driving circuit 216 calculates the difference between the relative velocity of the focused beam spot obtained from the focusing/tracking error detection circuit 217, and target velocity information sent from the controller 220, and feeds back that result to the driving current to be supplied to the optical head driving mechanism (feed motor) 203, thus moving the optical head 202. As described in "optical head moving mechanism", a frictional force always acts between a guide shaft and bushing or bearing. When the optical head 202 moves at high speed, dynamic friction acts. However, since the moving velocity of the optical head 202 is low at the beginning of movement and immediately before stop, static friction acts. At that time, since the relative frictional force increases, the amplification factor (gain) of a current to be supplied to the optical head driving mechanism (feed motor) 203 is increased in response to a command from the controller 220 (especially, immediately before stop).

4-2-3. Fine Access Control

When the optical head 202 has reached the target position, the controller 220 issues a command to the objective lens actuator driving circuit 218 to enable the track loop. The focused beam spot reproduces an address or track number of that portion while tracing along a track on the information recording medium 9. The current focused beam spot position is detected from that address or track number, and the controller 220 calculates the number of error tracks from the reached target position and informs the objective lens actuator driving circuit 218 of the number of tracks the focused beam spot is required to move. When the objective lens actuator driving circuit 218 generates a pair of kick pulses, the objective lens slightly moves in the radial direction of the information recording medium 9, thus moving the focused beam spot to a neighboring track. In the objective lens actuator driving circuit 218, the track loop is temporarily disabled, and after kick pulses are generated a given number of times corresponding to the information from the controller 220, the track loop is enabled again. Upon completion of fine access, the controller 220 reproduces information (address or track number) at the position where the focused beam spot is tracing, and confirms if it has accessed a target track.

4-3. Continuous Recording/Reproduction/Erasure Control

Figure 6:
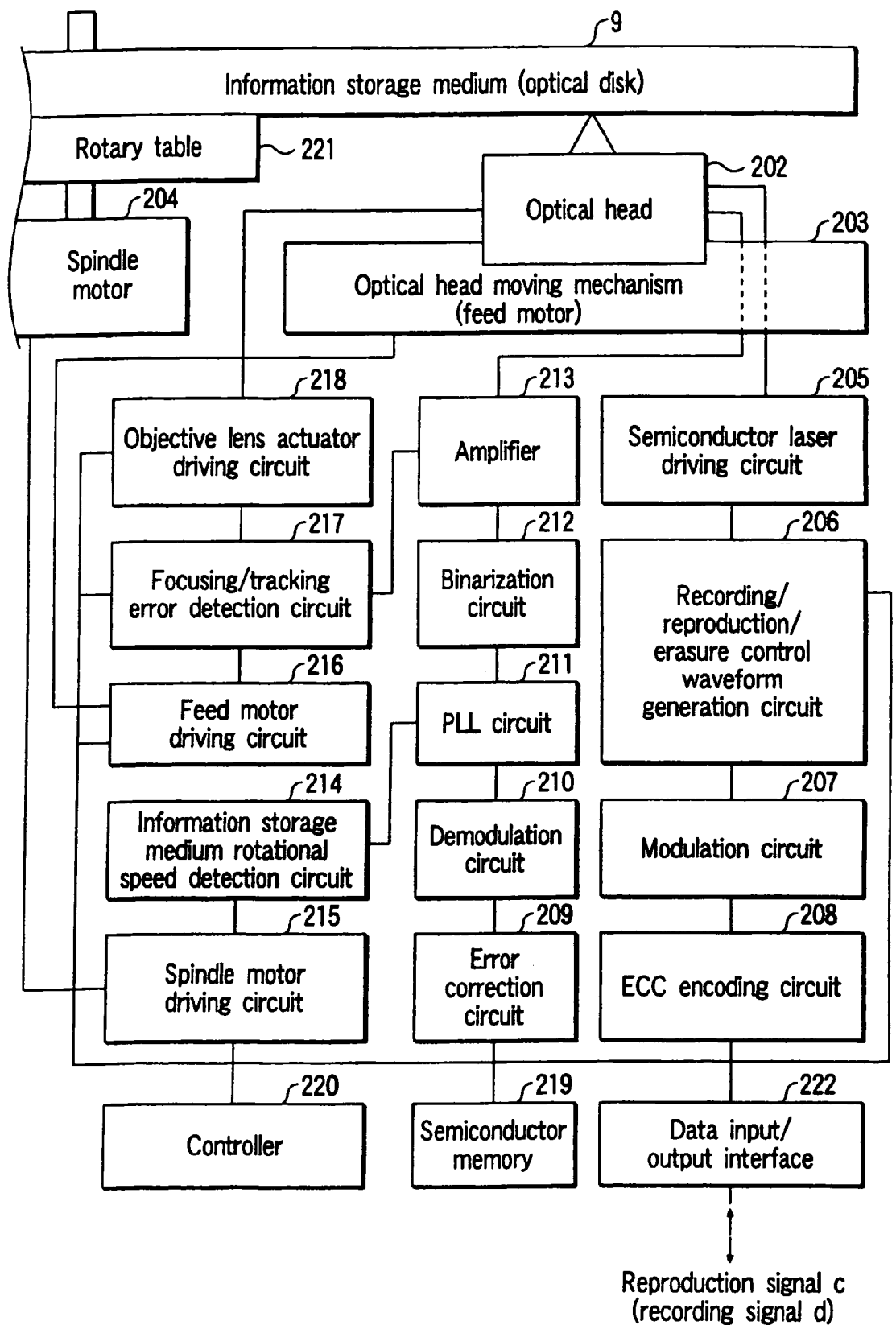
FIG. 6 is a schematic block diagram showing the arrangement of an information recording/reproduction apparatus according to an embodiment of the present invention.

As shown in FIG. 6, a tracking error detection signal output from the focusing/tracking error detection circuit 217 is input to the feed motor driving circuit 216. "Upon startup control" and "upon access control" mentioned above, the controller 220 controls the feed motor driving circuit 216 not to use the tracking error detection signal. After it is confirmed that the focused beam spot has reached the target track by access, some components of the tracking error detection signal are supplied as a driving current to the optical head driving mechanism (feed motor) 203 in response to a command from the controller 220. This control continues during the period in which a reproduction or recording/erasure process is done continuously. The information recording medium 9 is mounted so that its central position has a slight eccentricity from that of the rotary table 221. When some components of the tracking error detection signal are supplied as a driving current, the entire optical head 202 slightly moves in correspondence with the eccentricity. When the reproduction or recording/erasure process is continuously done for a long period of time, the focused beam spot position gradually moves toward the outer or inner periphery. When some components of the tracking error detection signal are supplied as a driving current to the optical head moving mechanism (feed motor) 203, the optical head 202 gradually moves toward the outer or inner periphery in correspondence with that current. In this manner, the load on tracking error correction of the objective lens actuator is reduced, thus attaining a stable track loop.

4-4. End Control

When a series of processes are complete and the operation is to be ended, the process is done in accordance with the following sequence. That is, 1) the controller 220 issues a command to the objective lens actuator driving circuit 218 to disable the track loop;

2) the,controller 220 issues a command to the objective lens actuator driving circuit 218 to disable the focus loop;

3) the controller 220 issues a command to the recording/reproduction/erasure control waveform generation circuit 206 to stop emission of the semiconductor laser element; and 4) the controller 220 informs the spindle motor driving circuit 215 of zero reference rotational speed.

5. Flow of Recording Signal/Reproduction Signal to Information Recording Medium

5-1. Signal Format Recorded on Information Recording Medium 9

In order to meet requirements:

of correcting recording information errors caused by defects on the information recording medium 9;

of simplifying a reproduction processing circuit by setting zero DC components of a reproduction signal; and of recording information at highest possible density on the information recording medium 9 for a signal to be recorded on the information recording medium 9, the information recording/reproduction apparatus (physical system block) performs "addition of an error correction function" and "signal conversion of recording information (signal modulation/demodulation)", as shown in FIG. 6.

5-2. Flow of Signal Upon Recording

5-2-1. ECC (Error Correction Code) Appending Process

Information to be recorded on the information recording medium 9 is input to a data input/output interface 222 as recording signal d in the form of a raw signal. This recording signal d is directly recorded in the semiconductor memory 219, and then undergoes an ECC appending process in an ECC encoding circuit 208, as will be described later.

Upon completion of appending of inner-code PI and outer-code PO, the ECC encoding circuit 208 reads data for one sector from the semiconductor memory 219, and transfers the read data to a modulation circuit 207.

5-2-2. Signal Modulation

In order to make a DC component (DSV: Digital Sum Value) of a reproduction signal approach zero, and to record information on the information recording medium 9 at high density, signal modulation as conversion of a signal format is done in the modulation circuit 207. The modulation circuit 207 and a demodulation circuit 210 include a conversion table indicating the relationship between a source signal and modulated signal. The signal transferred from the ECC encoding circuit 208 is segmented into data each consisting of a plurality of bits in accordance with a modulation scheme, and the segmented data is converted into other signals (codes) by looking up the conversion table. For example, when 8/16 modulation (RLL (2, 10) code) is used as the modulation scheme, two different types of conversion tables are present, and the conversion table to be looked up is switched as needed to make the DC component (DSV) after modulation approach zero.

5-3. Flow of Signal Upon Reproduction

5-3-1. Binarization/PLL Circuit

As described in "signal detection by optical head 202", a change in the amount of light reflected by the light reflection film or light reflective recording film of the information recording medium 9 is detected to reproduce a signal on the information recording medium 9. A signal obtained by the amplifier 213 has an analog waveform. The binarization circuit 212 converts that signal into a binary digital signal consisting of "1" and "0" using a comparator.

From the reproduction signal obtained by the binarization circuit, the PLL circuit 211 extracts a reference signal upon reproducing information. The PLL circuit 211 incorporates a variable frequency oscillator. The frequency and phase of a pulse signal (reference clock) output from the oscillator are compared with those of the output signal from the binarization circuit 212, and the comparison results are fed back to the oscillator output.

5-3-2. Signal Demodulation

The demodulation circuit 210 incorporates a conversion table indicating the relationship between modulated and demodulated signals. A modulated signal is restored to an original signal by looking up the conversion table in synchronism with the reference clock obtained by the PLL circuit 211. The restored (demodulated) signal is recorded in the semiconductor memory 219.

5-3-3. Error Correction Process

An error correction circuit 209 detects any errors of a signal saved in the semiconductor memory 219 using inner-code PI and outer-code PO, and sets pointer flags of error positions.

After that, the error correction circuit 209 corrects a signal at the error positions in accordance with the error pointer flags while reading out the signal from the semiconductor memory 219, removes inner-code PI and outer-code PO, and transfers the signal to the data input/output interface 222.

A signal sent from the ECC encoding circuit 208 is output as reproduction signal c from the data input/output interface 222.

This concludes the detailed description of FIG. 6 is to end.

Figure 7:
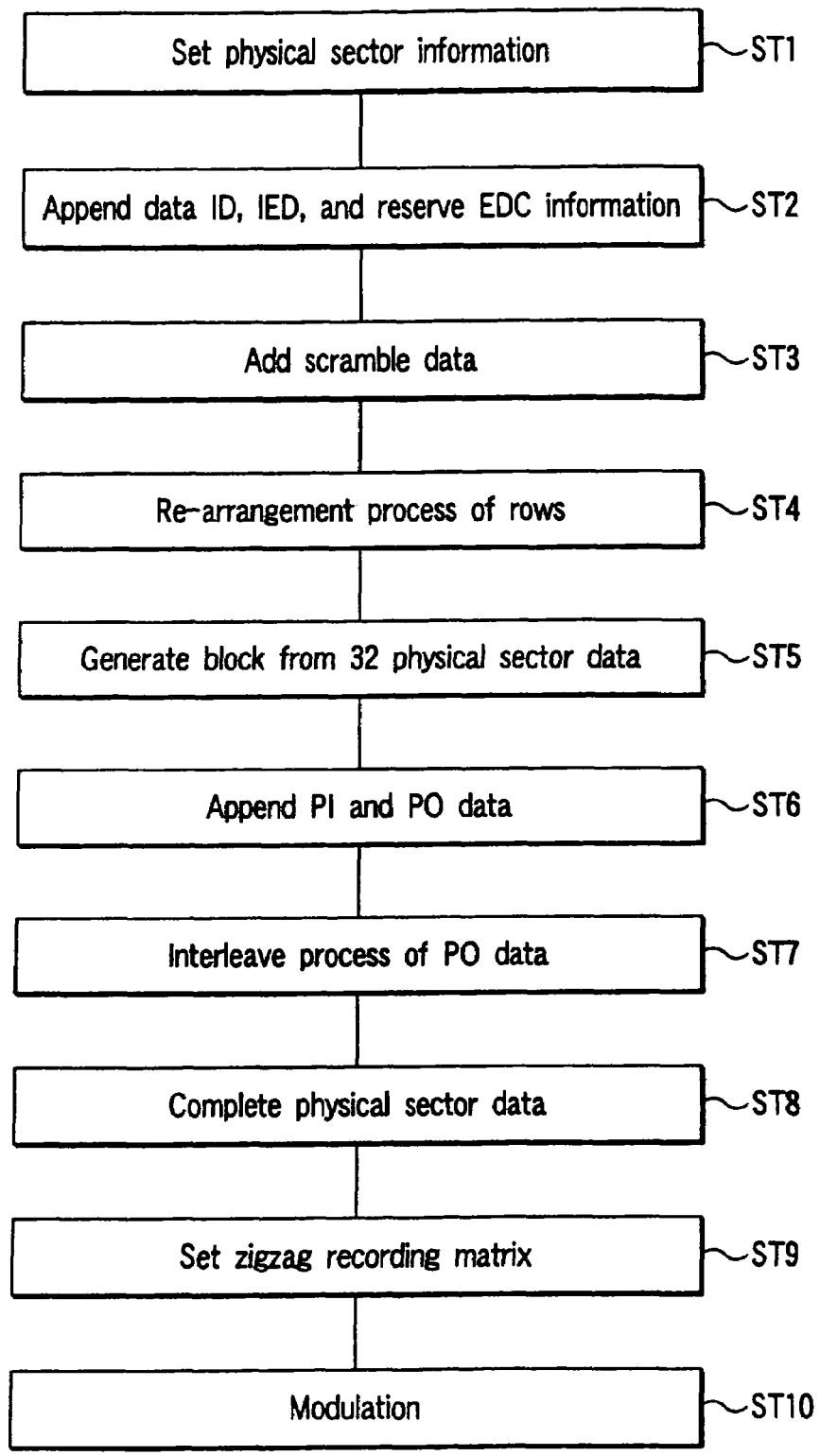
FIG. 7 is a flowchart for explaining generation of an ECC block and recording of physical sector data.

The format process sequence executed in the apparatus shown in FIG. 6 will be explained below using the flowchart shown in FIG. 7. The format process is implemented by the ECC encoding circuit 208 and controller 220. FIG. 7 shows the sequence of the data conversion process (format) based on method 1 shown in FIGS. 1 to 3.

Step 1) A plurality of pieces of physical sector information 4-0 to 4-31 are set (segmented into main data in units of 2048 bytes) in correspondence with the size of a plurality of pieces of logical sector information 3-0 to 3-31. User data to be recorded is handled in units of 2048 bytes.

Step 2) 2068-byte sector data is generated from 2048-byte main data, 16-byte auxiliary data, and a 4-byte error detection code (EDC).

As shown in FIG. 8, the 16-byte auxiliary data contains 4-byte data ID data (PID), a 2-byte error detection code (IED) for the data ID, and 10-byte reserve data (RSV). The PID records a sector number used to identify a data sector, and sector information used to identify the contents of the data sector. The IED is used to detect any errors generated in the PID portion. The RSV is used to record other kinds of auxiliary information (e.g., copyright management information). The EDC is used to detect any errors generated in 2064-byte main data and auxiliary data. The data sectors are arranged in a 188 (columns)×11 (rows) matrix, as shown in FIG. 8.

Step 3) Scramble data is added to 2048-byte main data of each sector data.

Step 4) The rows of the sector data shown in FIG. 8 are re-arranged depending on whether the sector number is even or odd, as shown in FIG. 9. Numerals in FIG. 9 indicate row numbers in the sector data. Also, as shown in FIG. 9, re-arrangement types α and β are available.

Step 5) A sector block is generated by vertically stacking 32 continuous data sectors, which are re-arranged depending on their sector numbers. The data sectors which are vertically stacked are arranged in a 376 (columns)×176 (rows) matrix, as shown in FIG. 10.

Figure 11:
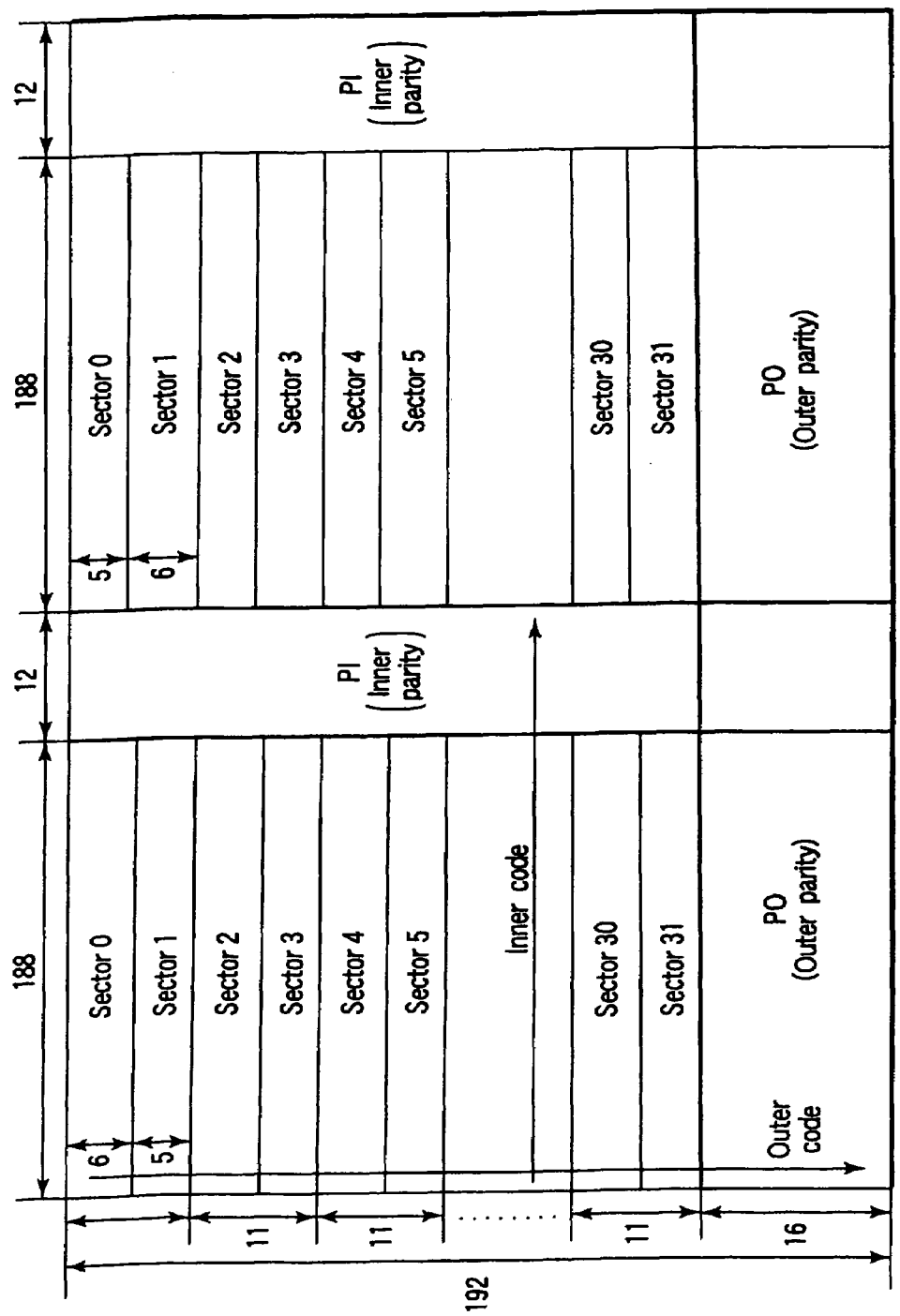
FIG. 11 shows a state wherein the sector block shown in FIG. 10 is horizontally segmented into two blocks, and outer and inner code parties are appended to the respective blocks.

Step 6) The sector block is horizontally segmented into two blocks to encode error correction codes. The 188 (columns)× 176 (rows) blocks after segmentation undergo encoding in the column direction to generate outer-code parity (PO) data for 16 rows. The outer code uses a REED Solomon code of RS(192, 176, 17). Subsequently, inner-code encoding is done in the row direction to generate inner-code parity data (PI) for 12 columns. The inner code uses a REED Solomon code of RS(200, 188, 13). ECC blocks containing parity data generated based on the inner and outer codes are as shown in FIG. 11.

Step 7) The ECC blocks undergo row interleave to distribute 16 right and left rows of PO data into the blocks. Thirty-two rows (=16×2) of PO data are distributed row by row to sectors. At this time, PO rows of the left block are inserted after the lowermost row of only five odd rows, and PO rows of the right block are inserted after the lowermost row of only five even rows. FIG. 3 shows the ECC blocks after row interleave.

Figure 12:
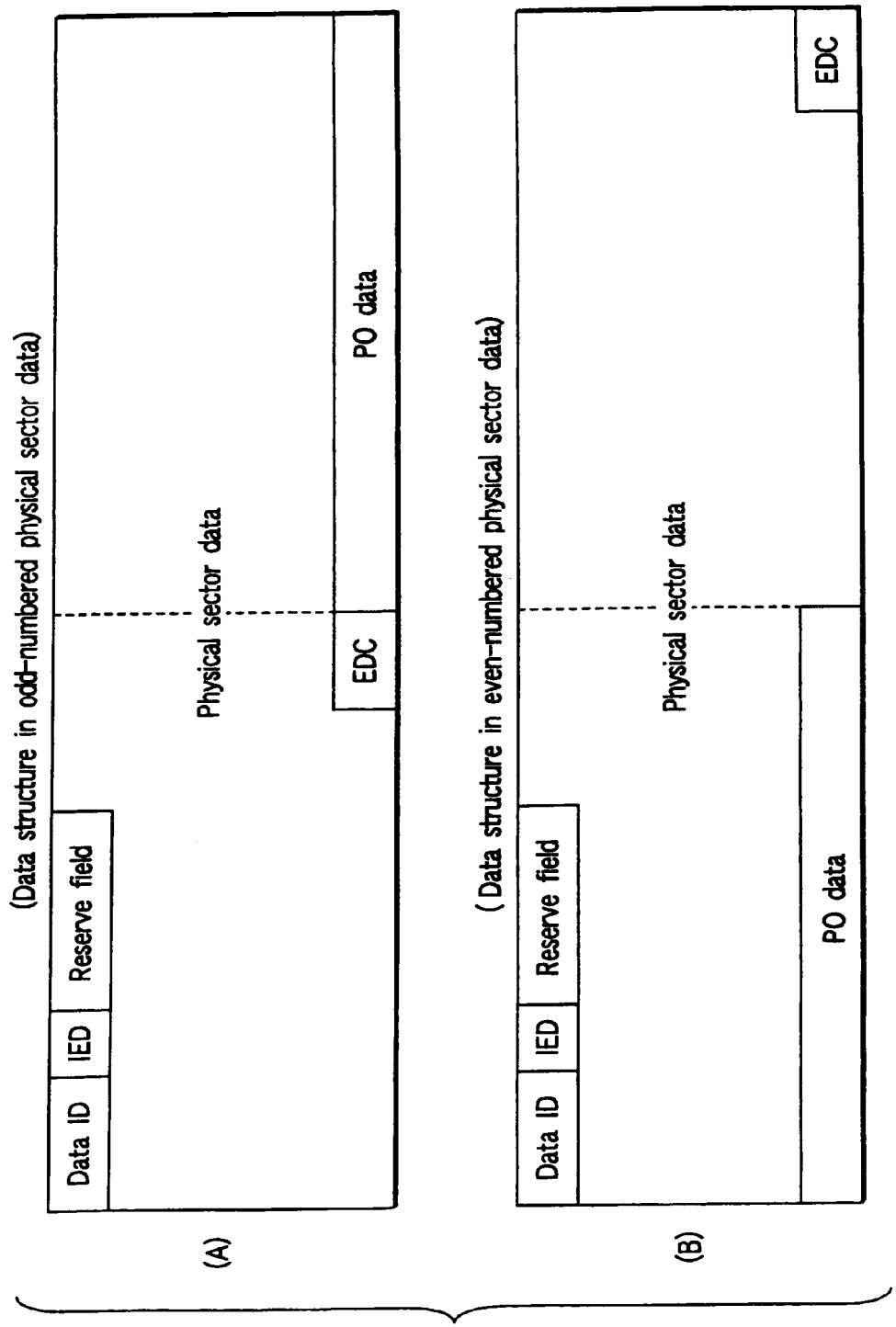
FIG. 12 shows the data structure of physical sector data generated from an ECC block upon completion of row interleave shown in FIG. 3.

Step 8) Physical sector data is completed. FIG. 12 shows the completed physical sector data (=physical sector data blocks).

Step 9) A zigzag recording matrix is set.

Step 10) A modulation process is executed. If a bit sequence of data to be recorded is directly recorded on the medium, the characteristic feature of the recording data sequence does not match the recording characteristics of the medium, and efficient recording cannot be done. In consideration of the recording characteristics of the medium, a data pattern is converted according to a predetermined conversion rule. For example, the modulation scheme includes an 8/16 modulation scheme for converting 1-byte data into a 16-bit pattern, an 8/12 modulation scheme for converting 1-byte data into a 1.5-byte pattern, a 12/18 modulation scheme for converting 12-bit data into an 18-bit pattern, and the like. Any one of these schemes comprises a plurality of conversion tables and a logic circuit for selecting the conversion table.

Especially, since the 12/18 modulation scheme that converts 1.5-byte data has a characteristic of expanding an error at one position to 1.5 bytes, it is effective for the process executed in step 9 to distribute errors upon reproduction.

Via steps 1 to 10, zigzag recording according to the setup in step 9 is done. Zigzag recording will be described in detail below. The contents of the physical sector data structure shown in FIG. 12 are segmented further finely. Assume that the fine segmentation size is 1 byte, as shown in, e.g., FIG. 13. However, the present invention is not limited to such specific segmentation unit length, and for example, a 2- or 4-byte unit may be used. Data are selected and extracted across rows for respective segmentation units, and are recorded on the physical sector area 9a on the optical disk (information recording medium 9) in accordance with the order they are selected and extracted. One physical sector data is recorded on one physical sector area 9a.

Figure 13:
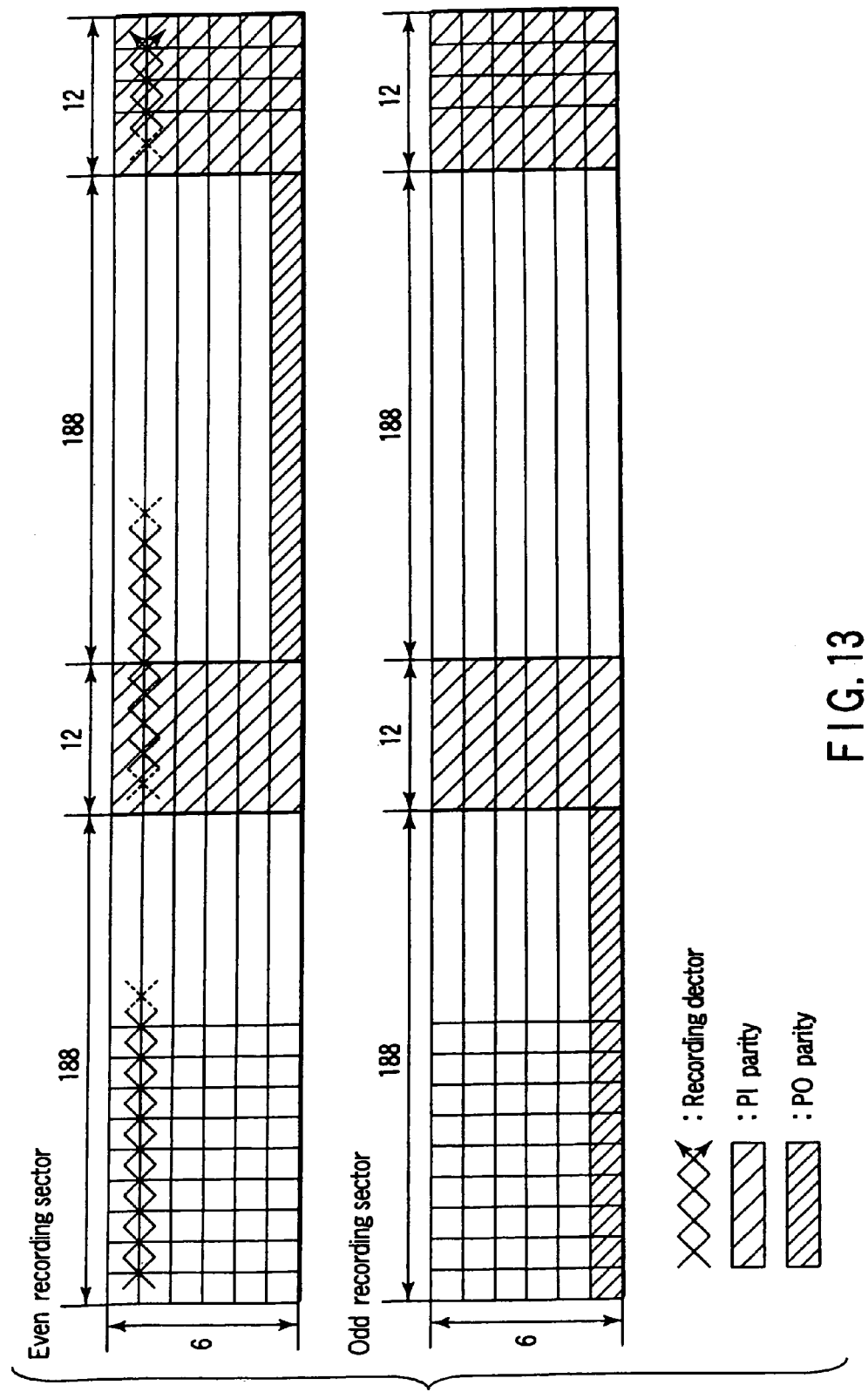
FIG. 13 shows a state wherein data contained in physical sector data undergoes zigzag recording.

For example, as shown in FIG. 13, two upper and lower rows are paired, data in these upper and lower rows is extracted alternately (in a zigzag pattern) for respective segmentation units, and upon completion of one cycle of data extraction in a single column, unextracted data in these pairs of rows is alternately fetched and recorded on the physical sector area 9a on the optical disk (information recording medium 9).

In this case, the format method for method 1 has been mainly explained. However, the process in step 9 is also effective for method 2. Especially, in method 2, since neighboring rows belong to the different ECC blocks 7-0 and 7-1, as shown in FIGS. 4 and 5, if data is arranged across rows, data distribution across the ECC blocks 7-0 and 7-1 is attained. Hence, error distribution can be attained at a level finer than the interleave process across the ECC blocks 7-0 and 7-1 for respective rows.

In FIG. 13, data is extracted in a zigzag pattern from a pair of rows. However, the present invention is not limited to this. For example, data may be sequentially extracted across three rows, or data may be selected and extracted for respective segmentation units across all six rows, and may be re-arranged and recorded on the physical sector area 9a on the optical disk (information recording medium 9).

As another recording method, data of different ECC blocks every rows may be alternately recorded for several bytes, e.g., 1 byte.

Also, recording of data for one row in an order it is arranged does not disturb the basic feature of the present invention.

Furthermore, a physical sector information portion may be re-arranged in any stage before step 6 so that auxiliary information containing at least an ID continuously appears on a recorded data sequence in accordance with the data recording order in step 9.

The information recording medium on which physical sector data is recorded in this way is reproduced by the information recording/reproduction apparatus shown in FIG. 6. That is, physical sector data is read out from a predetermined number of (32) physical sector areas 9a, n (2) ECC blocks are generated from the readout physical sector data, sector data is generated and reproduced from the ECC blocks via an error correction process. The physical sector data is read out by the optical head. The sector data is reproduced by the error correction circuit 209.

More specifically, by utilizing a process opposite to that for generating a predetermined number of physical sector data from n ECC blocks, n ECC blocks are generated from the predetermined number of physical sector data items read out from the predetermined number of physical sector areas 9a. That is, two ECC blocks shown in FIG. 3 are generated from the physical sector data shown in FIG. 12. Subsequently, by utilizing a process opposite to that for generating ECC blocks after row interleave from those before row interleave, the n generated ECC blocks are restored to n ECC blocks before row interleave. That is, n (2) ECC blocks shown in FIG. 3 are restored to n ECC blocks shown in FIG. 11. At this time, an error correction process is executed using outer- and inner-code parity data appended to the ECC blocks. By utilizing a process opposite to that for generating ECC blocks from sector blocks, the ECC blocks are restored to sector blocks. That is, outer- and inner-code parity data is removed from the ECC blocks shown in FIG. 11 to generate sector blocks shown in FIG. 10. Then, by utilizing a process opposite to that for generating sector blocks from sector data, sector data is generated from the sector blocks. That is, sector data shown in FIG. 9 is generated from the sector blocks shown in FIG. 10. Since the generated sector data is in the re-arranged state, it is restored to an original arrangement upon reproduction.

Note that the physical sector data has a data structure in which the data ID is arranged at the head of the data, and a data line formed by only a portion of outer-code parity data is arranged as the final line. Hence, the information recording/reproduction apparatus shown in FIG. 6 can reproduce the data ID by reading out the head data of the physical sector data. Each physical sector area records data alternately extracted from different data lines in the physical sector data in turn (zigzag recording). Hence, the information recording/reproduction apparatus reproduces each physical sector area under the condition that data alternately extracted from different data lines is recorded.

Figure 14:
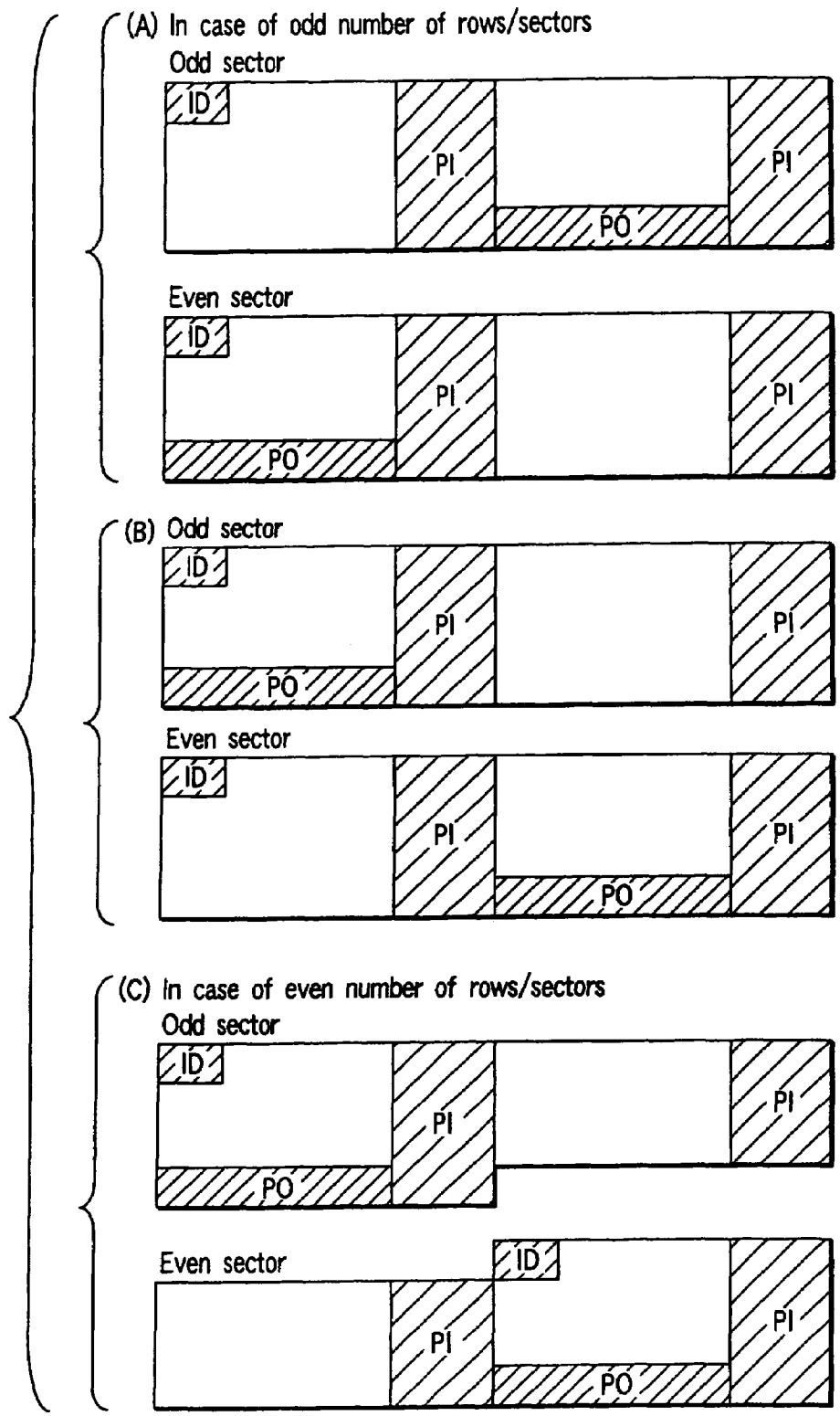
FIG. 14 shows examples of the arrangement of an outer code (PO) in physical sector data.

FIG. 14 shows another embodiment of the data structure in physical sector data in method 1. As shown in FIG. 14, data structures (A) to (C) are available, and are application examples which can be basically generated via the aforementioned steps.

The format process for case (C) in FIG. 14, i.e., a case wherein one sector is formed of an even number of rows, will be explained below using the flowchart shown in FIG. 7 again.

The process to be described below is executed in the ECC encoding circuit 208 shown in FIG. 6, and detailed control is made by the controller 220.

Step 1) A plurality of pieces of physical sector information 4-0 to 4-31 are set (segmented into main data in units of 2048 bytes) in correspondence with the size of a plurality of pieces of logical sector information 3-0 to 3-31. User data to be recorded is handled in units of 2048 bytes.

Figure 16:
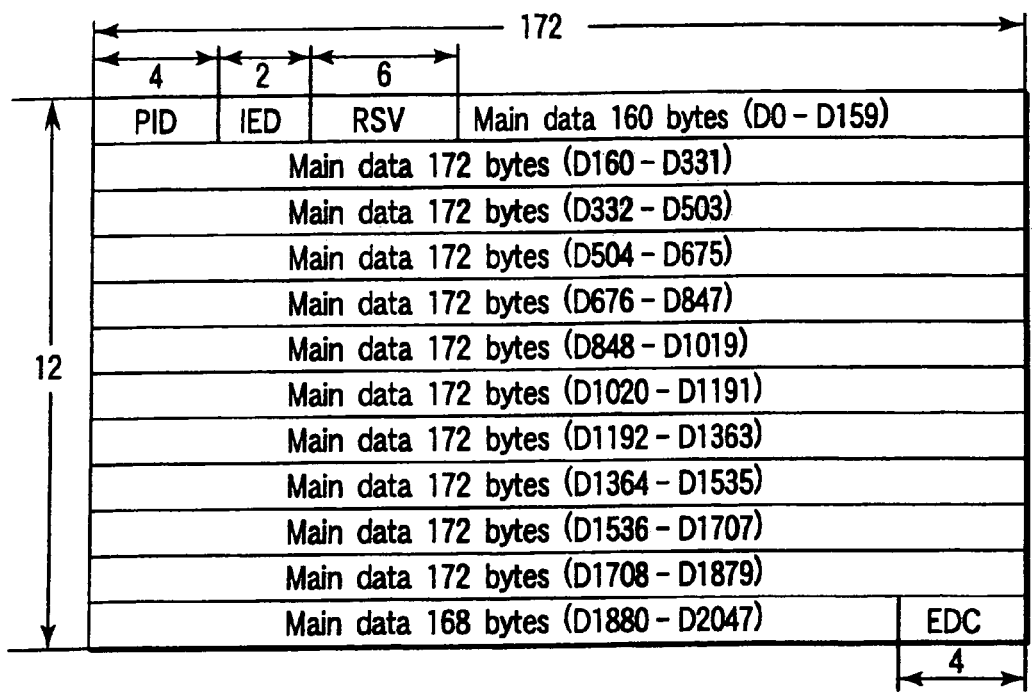
FIG. 16 shows the data structure of sector data when one sector data is formed of an even number of rows.

Step 2) 2064-byte sector data is generated from 2048-byte main data, 12-byte auxiliary data, and a 4-byte error detection code (EDC). As shown in FIG. 16, the 12-byte auxiliary data contains 4-byte data ID data (PID), a 2-byte error detection code (IED) for the data ID, and 6-byte reserve data (RSV). The sector data is arranged in a 172 (columns)×12 (rows) matrix, as shown in FIG. 16.

Step 3) Scramble data is added to 2048-byte main data of each sector data.

Step 4) The rows of the sector data shown in FIG. 16 are re-arranged depending on whether the sector number is even or odd, as shown in FIG. 17. Numerals in FIG. 17 indicate row numbers in the sector data. Also, as shown in FIG. 17, re-arrangement types α and β are available.

Figure 18:
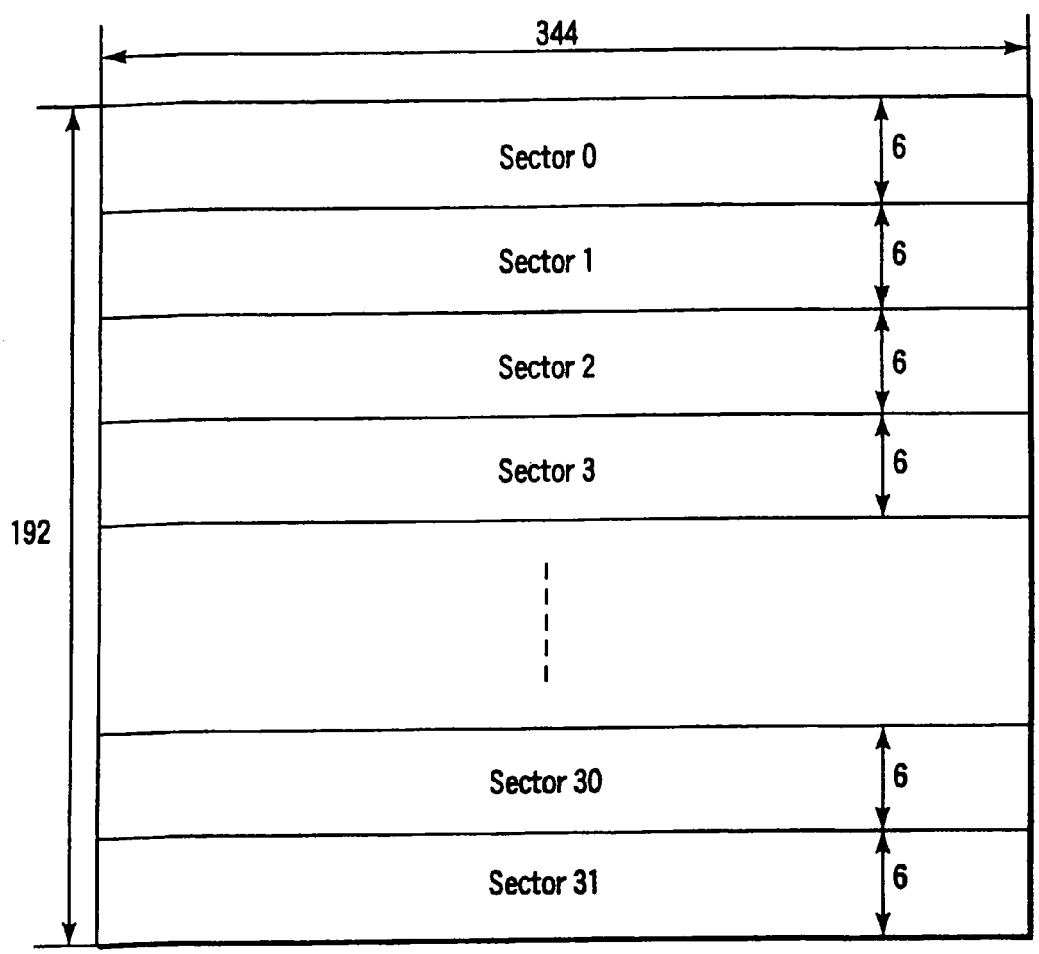
FIG. 18 shows the data structure of sector data when one sector data is formed of an even number of rows.

Step 5) A sector block is generated by vertically stacking 32 continuous data sectors, which are re-arranged depending on their sector numbers. The sectors are which are vertically stacked are arranged in a 344 (columns)×192 (rows) matrix, as shown in FIG. 18.

Step 6) The sector block is horizontally segmented into two blocks to encode error correction codes. The 172 (columns)×192 (rows) blocks after segmentation undergo encoding in the column direction to generate outer-code parity (PO) data for 16 rows. The outer code uses a REED Solomon code of RS(208, 192, 17). Subsequently, inner-code encoding is done in the row direction to generate inner-code parity data (PI) for 12 columns. The inner code uses a REED Solomon code of RS(184, 172, 13). ECC blocks containing parity data generated based on the inner and outer codes are as shown in FIG. 19.

Figure 15:
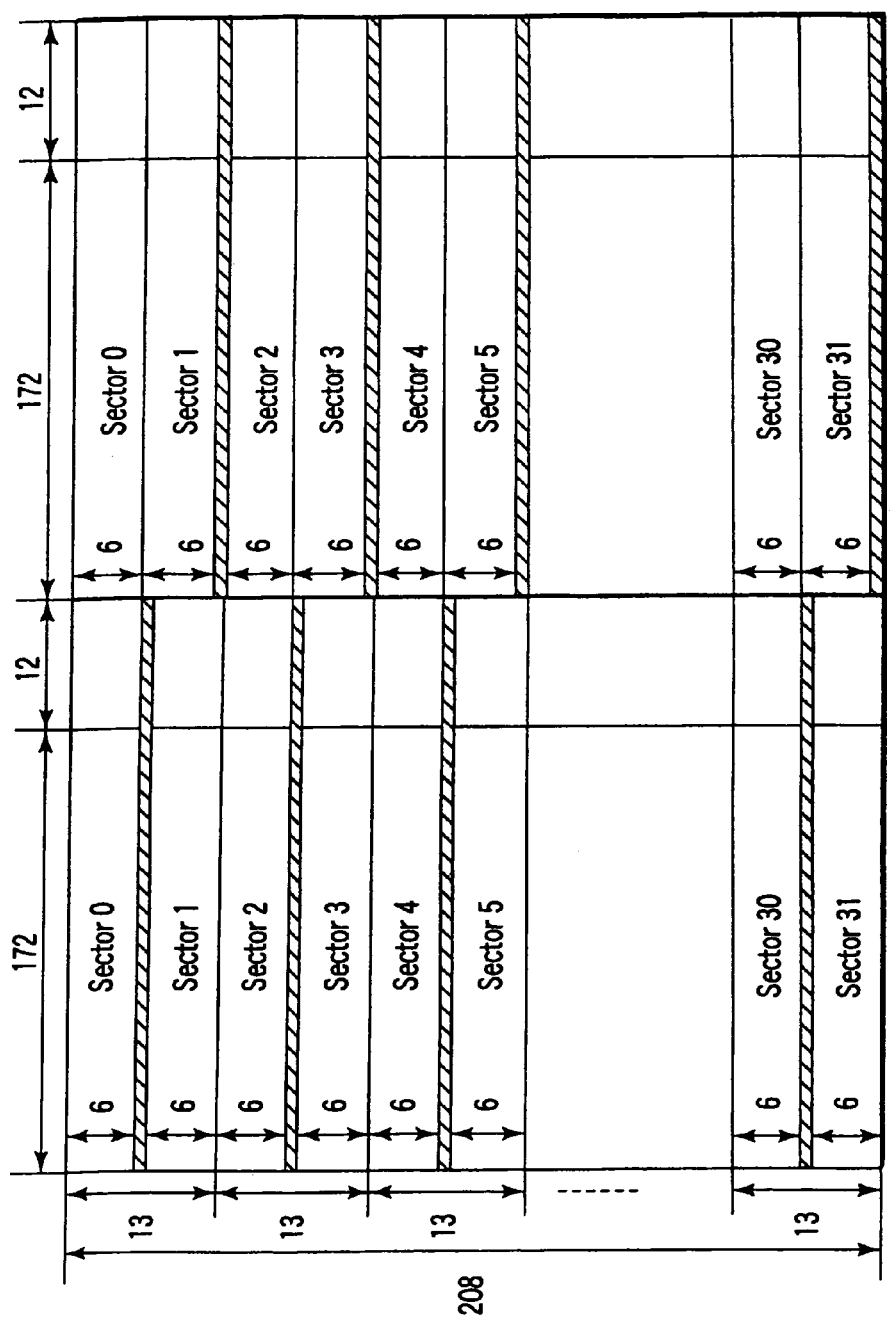
FIG. 15 shows the data structure of an ECC block upon completion of row interleave when one sector data is formed of an even number of rows.

Step 7) The ECC blocks undergo row interleave to distribute 16 right and left rows of PO data into the blocks. Thirty-two rows (=16×2) of PO data are distributed row by row to sectors. As the distribution destinations of PO data, this data is inserted after the lowermost row of even sectors in the left block, and after the lowermost row of odd sectors in the right block. FIG. 15 shows the ECC blocks after row interleave.

Step 8) Physical sector data is completed. FIG. 20 shows the completed physical sector data.

Step 9) In this case, the setup of the zigzag recording matrix is omitted. This is because two different physical sector data items are involved at the lowermost row of the physical sector data (see FIG. 15). If the zigzag recording matrix is set in this case, two different physical sectors are mixed together in one physical sector area.

Step 10) A modulation process is executed. If a bit sequence of data to be recorded is directly recorded on the medium, the characteristic feature of the recording data sequence does not match the recording characteristics of the medium, and efficient recording cannot be done. In consideration of the recording characteristics of the medium, a data pattern is converted according to a predetermined conversion rule.

The information recording medium on which physical sector data is recorded in this way is reproduced by the information recording/reproduction apparatus shown in FIG. 6. That is, physical sector data is read out from a predetermined number of (32) physical sector areas 9a, n (2) ECC blocks are generated from the readout physical sector data, sector data is generated and reproduced from the ECC blocks via an error correction process.

More specifically, by utilizing a process opposite to that for generating a predetermined number of physical sector data items from n ECC blocks, n ECC blocks are generated from the predetermined number of physical sector data items read out from the predetermined number of physical sector areas 9a. That is, two ECC blocks shown in FIG. 15 are generated from the physical sector data shown in FIG. 20. Subsequently, by utilizing a process opposite to that for generating ECC blocks after row interleave from those before row interleave, the n generated ECC blocks are restored to n ECC blocks before row interleave. That is, n (2) ECC blocks shown in FIG. 15 are restored to n ECC blocks shown in FIG. 19. At this time, an error correction process is executed using outer- and inner-code parity data appended to the ECC blocks. By utilizing a process opposite to that for generating ECC blocks from sector blocks, the ECC blocks are restored to sector blocks. That is, outer- and inner-code parity data is removed from the ECC blocks shown in FIG. 19 to generate sector blocks shown in FIG. 18. Then, by utilizing a process opposite to that for generating sector blocks from sector data, sector data is generated from the sector blocks. That is, sector data shown in FIG. 17 is generated from the sector blocks shown in FIG. 18. Since the generated sector data is in the re-arranged state, it is restored to an original arrangement upon reproduction.

Note that the physical sector data has a data structure in which the data ID is arranged at the head of the data, and a data line formed by only a portion of outer-code parity data is arranged as the final line. Hence, the information recording/reproduction apparatus shown in FIG. 6 can reproduce the data ID by reading out the head data of the physical sector data.

Points of the present invention described above will be summarized below.

(1) One physical sector is segmented into rows including PI, and row data is assigned to a plurality of ECC blocks.

(2) In the data arrangement of all physical sectors, the data ID is always arranged at the head position. This structure matches the data arrangement in physical sectors of the existing DVD. In this manner, since the data arrangement in an important portion in each physical sector matches that of the existing DVD standards, the access control and sector address detection/confirmation processes in a reproduction apparatus or recording/reproduction apparatus having compatible functions between the existing DVD and next-generation DVD can be commonly used, thus simplifying control in the apparatus.

(3) All physical sectors have equal sizes.

(4) "2 ECC blocks=32 physical sectors" is set as a basic unit in correspondence with the SOBU size, and all data in 32 physical sectors is assigned to two ECC blocks in the basic unit.

(5) Physical sector information matches logical sector information. The contents of one physical sector data are segmented into rows each including PI data, row data is assigned in turn to n (n≧2) ECC blocks, and the total of the number of rows each including PI in one physical sector data and the number of PO rows is an integer multiple of n.

(6) All pieces of information in one logical sector are contained in data in a single ECC block.

(7) Data in rows assigned to different ECC blocks in a single physical sector is selected in turn and is recorded on the optical disk.

The arrangements and effects of the information recording medium, information recording apparatus, and information reproduction apparatus of the present invention will be described in detail below.

<1> First to fifth data units are defined as follows.

A minimum unit recorded on a medium from which information can be reproduced or on which information can be recorded is defined as a first data unit (physical sector). A second data unit (a group of n ECC blocks) including the first data unit is defined. A third data unit (ECC block data) which is included in the second data unit and forms an ECC block that forms a REED Solomon product code is defined. The second data unit includes n (n is a positive number equal to or greater than 2) independent third data units having equal data sizes. A fourth data unit which is included in the third data unit and forms one row as a data arrangement appended with PI (inner-code parity) data is defined. A fifth data unit (PO for one row) which forms PO (outer-code parity) data in the third data unit and is segmented to be equal to the size (row size) of the fourth data unit is defined.

The first data unit is formed by a set of fourth and fifth data units, the total of the number of fourth data units (the number of rows containing PI) and the number of fifth data units (the number of PO rows) is an integer multiple of n, and a data structure in which data of the fourth data units is always arranged at specific positions in the first data unit and a data ID containing address information is always arranged at a specific position in the fourth data unit is generated.

The information recording medium of the present invention comprises a physical sector area on which data with the aforementioned data structure is recorded. The information recording apparatus and method of the present invention generate data with such a data structure, and record the data with the data structure on the information recording medium. Furthermore, the information reproduction apparatus and method of the present invention reproduce the information recording medium on which the data with such a data structure is recorded.

The relationship between the aforementioned data units is as follows.

| second data unit (n × ECC block) | ⊃ | first data unit (physical sector) | ⊃ | fourth data unit (row including PI) |
|---|---|---|---|---|
| second data unit (n × ECC block) | ⊃ | Third data unit (ECC block) | ⊃ | fourth data unit (row including PI) |
| second data unit (n × ECC block) | ⊃ | Third data unit (ECC block) | ⊃ | fifth data unit (row including PO) |

The points of the present invention are as follows.

1) Data in one physical sector is segmented into rows, and row data is assigned to a plurality of ECC blocks.

2) A data ID is arranged at the head position in the physical sector, and PO data for one row is arranged in a row other than the first row.

3) The sum of the number of rows including PI and the number of PO rows is an integer multiple of the number of corresponding ECC blocks.

The effects of the present invention are as follows.

1) Since the physical sector information size is the same as that in the existing DVD (2048 bytes), full compatibility between the standard contents of the logical layer and application layer of the existing DVD can be assured, and existing DVD data can be effectively used by exchange and mixed storage of data recorded on existing DVDs is possible.

2) Since n third data units are included in the second data unit, and physical sector data (first data unit) is interleaved and arranged in different ECC blocks (third data units) for respective rows (fourth data units), an error-correctable burst error length can be improved approximately to n times. Hence, the present invention can relatively easily improve the error-correctable burst error length greatly without considerably lowering the main data information encoding efficiency compared to the existing DVD standards.

3) The effect of a perfect product code formed by appending inner-code (PI) data in the horizontal direction and outer-code (PO) data in the vertical direction is as follows.

Since inner-code correction for outer-code parity data and outer-code correction for inner-code parity data can be done, correction performance can be improved by repeating correction using inner and outer code data for all recorded data.

In combination with recording interleave, both distribution of successive errors to inner-code data and perfection of a product code that allows repetitive correction can be achieved.

Upon examining a method of "appending inner-code data obliquely for the purpose of distributing successive errors" for the purpose of comparison so as to obtain the effect of "the perfect product code formed by appending inner-code (PI) data in the horizontal direction and outer-code (PO) data in the vertical direction", perfection of the product code is impaired, and correction performance cannot be improved by repeating correction using inner- and outer-code data in such a case.

4) Except for interleave between a plurality of ECC blocks, data correspondence in the ECC blocks and physical sector data matches that of the existing DVD standards:

correspondence between physical sector data and ECC block data for respective rows including PI; and interleaved arrangement of PO in ECC blocks to respective physical sectors.

In this manner, some of the ECC block generation process (generation of PI and PO, and the like) and error correction processes in a reproduction apparatus or recording/reproduction apparatus having compatible functions between the existing DVD and next-generation DVD can be used common to those used upon using an existing DVD disk (medium), and the processing routines and circuits of the reproduction apparatus or recording/reproduction apparatus having compatible functions between existing DVDs and next-generation DVD can be simplified.

5) Since a data ID is arranged at the head of physical sector data as in the existing DVD standards, the access control and sector address detection/confirmation processes in a reproduction apparatus or recording/reproduction apparatus having compatible functions between existing DVDs and next-generation DVDs can be commonly used, thus simplifying control in the apparatus.

6) Since the total of the number of rows including PI (the number of fourth data units) and the number of PO rows (the number of fifth data units) included in the physical sector (first data unit) is an integer multiple of n, all data contained in one physical sector can be uniformly distributed (interleaved and arranged) in all corresponding ECC blocks. Since all data can be evenly arranged in the ECC blocks, an interleave process to the ECC blocks can be facilitated, and equal error-correctable burst error lengths can be obtained independently of the positions on the optical disk, thus preventing adverse influences of burst errors on reproduced information. That is, since an interleave process is made to alternately record n product code data items on respective rows, uniform burst error correction performance can be obtained. Hence, there is no locally weak burst error correction performance portion. Even when an interleave process for alternately arranging data is done, all the sectors can have equal sector lengths.

7) All the physical sectors have the same number of PO data items to have equal physical sector sizes, and the following merits can be obtained.

In the prior art, in order to interleave a plurality of product codes and to distribute outer-code parity data in respective rows, outer-code parity rows must be inserted in a plurality of sectors. Hence, a set of a plurality of sectors must be recorded, or two different types of sectors, i.e., sectors with and without parity data must be prepared.

According to the present invention, a rewrite can be made for each sector. Especially, since an exchange process of defective sectors can be done for respective sectors, the reserve sector size required for the exchange process can be reduced. Also, since the area, use of which is disabled due to defects, can be reduced, the disk use efficiency can be improved. Also, as sector identification data (ID) to be assigned to respective sectors can be recorded at equal intervals in recording data, the ID can be easily detected and reproduced.

In the invention described above, for example, n=2 is set. In correspondence with the SOBU size, "2 ECC blocks=32 physical sectors" is set as a basic unit, and all data in 32 physical sectors is assigned to 2 ECC blocks in the basic unit to assure full compatibility with the stream standards. Also, the recording/reproduction process of a data recording apparatus complying with the stream standards can be simplified.

<2> Furthermore, a sixth data unit is defined as follows.

A sixth data unit (e.g., byte unit) obtained by further segmenting the fourth data unit (row) is defined. Since "fifth data unit=PO for one row" has already been defined, "sixth data unit=recording interleave unit across rows" is defined to avoid confusion.

The information recording medium of the present invention comprises a physical sector area where sixth data units selected in turn from different fourth data units are recorded. The information recording apparatus and method of the present invention select sixth data units in turn from different fourth data units, and record them on the physical sector area of the information recording medium. The information reproduction apparatus and method of the present invention reproduce the physical sector area on which sixth data units selected in turn from different fourth data units are recorded.

The relationship between the aforementioned data units is as follows.

| fourth data unit (row including PI) | ⊃ | sixth data unit (byte unit) |
| --- | --- | --- |

The point of the aforementioned invention is as follows.

Errors can be distributed by recording interleave (zigzag recording) among rows in a single physical sector.

The effects of the present invention are as follows.

Conventionally, recording is done in the same direction as inner-code data. If successive data items have error correlation, a run of a plurality of bytes may readily cause errors at the same time, and it is highly likely to disable correction of inner-code data. As a result, the error correction performance is lowered considerably compared to a case wherein random errors are assumed. When the entire product code is obliquely recorded to distribute errors, a plurality of sectors may simultaneously cause errors.

The error characteristics of reproduced data have error correlation in successively recorded data items due to the influence of dust or the like. If error correlation is present, successive errors readily occur compared to a case wherein it is assumed that errors occur randomly. In order to distribute errors that occur successively to different inner-code data, the recording direction is set in a zigzag pattern with respect to the direction of inner-code data. As a result, since the number of correctable inner-code data items increases, the error correction performance can be improved. Since the zigzag pattern of the recording direction is limited to the range of one sector, successive errors never spread to a plurality of sectors. Hence, a plurality of sectors can be avoided from causing errors due to serious errors.

<3> Moreover, physical sector information and logical sector information are defined as follows.

User information recorded in a physical sector that forms the first data unit is defined as physical sector information. The minimum unit of user information transferred in a data recording apparatus or data reproduction apparatus, or the minimum unit of user information transferred in the data recording apparatus or between the data reproduction apparatus and external device is defined as logical sector information.

The information recording medium of the present invention comprises a physical sector area that records data which is generated so that the contents of the physical sector information match those of the logical sector information. The information recording apparatus of the present invention generates and records data so that the contents of the physical sector information match those of the logical sector information. The information reproduction apparatus and method of the present invention reproduce the physical sector area that records data which is generated so that the contents of the physical sector information match those of the logical sector information. In this manner, the physical sector information can match the logical sector information.

The effects of the aforementioned invention are as follows.

1) Data access can be made for respective logical sectors. When the error rate of a reproduced signal from the optical disk is low, and error correction of respective rows in the physical sector can be made using only PI information, error-free (accurate) physical sector information can be read out without using PO information. Hence, when ECC blocks are formed so that logical sector information matches physical sector information as in the present invention, if the error rate of a reproduced signal from the optical disk is low, one logical sector information can be read out by only reproducing one physical sector data from the optical disk without using any PO information, thus allowing very easy data access.

In the present invention, a data ID containing sector address information is arranged at the head position in each physical sector data item. In general, this data ID is used to access data recorded on the optical disk. According to the present invention, since the contents of the logical sector information match those of the physical sector information, logical sector information can be recorded in this data ID. Hence, as logical sector address information in physical sector data can be directly accessed to access the logical sector position designated by the application or logical layer, the data access time can be greatly shortened.

2) According to the present invention, data continuity can be easily assured. In the format of the application standards, AV information and stream information are successively recorded in the order of logical sector addresses. In the present invention, since the contents of logical sector information match those of physical sector information, logical sector information can be recorded in the data ID. As a result, the order AV information and stream information to be recorded or reproduced in the order logical sector addresses are arranged matches the order of physical sector addresses, which is set in accordance with the order physical sectors are arranged on the optical disk. Consequently, an unnecessary access process (track jump process) upon successively recording or reproducing AV information and stream information on/from the optical disk can be greatly reduced, and continuity of AV information and stream information upon recording or reproduction can be easily assured.

3) According to the present invention, a defect process can be easily done for respective sectors.

In the prior art, when a plurality of product codes is generated in an integer number of sectors and the codes are interleaved, data of a plurality of sectors is mixed together upon recording. Hence, if successive burst errors have occurred due to defects, errors may be simultaneously produced in a plurality of sectors. Normally, since the presence/absence of errors is finally checked for each sector, many sectors readily become defective at the same time. Also, since logical addresses are nonuniformly recorded, recorded data cannot be efficiently searched.

According to the present invention, when uncorrectable errors have occurred due to defects, the residual errors can be prevented from spreading after correction. As a result, the number of sectors that contain errors can be minimized. When a specific sector is searched for while reproducing data, the target position can be easily found due to continuity of sector numbers.

<4> Furthermore, the information recording medium of the present invention comprises a physical sector area that records data which is generated, so that the arrangement of at least some data in at least one of a plurality of ECC blocks matches the contents of logical sector information. The information recording apparatus and method of the present invention generate and record data so that the arrangement of at least some data in at least one of a plurality of ECC blocks matches the contents of the logical sector information. The information reproduction apparatus and method of the present invention reproduce the physical sector area that records data which is generated, so that the arrangement of at least some data in at least one of a plurality of ECC blocks matches the contents of the logical sector information. In this way, the contents of the logical sector information match the data arrangement in an ECC block.

The effect of the aforementioned invention is as follows.

Processes until formation of ECC blocks for logical sector information, which is to be transferred in a data recording apparatus or between a data reproduction apparatus and external device, match those until formation of ECC blocks in the existing DVD. Hence, some of the ECC block generation processes (generation of PI and PO, and the like) and error correction processes in a reproduction apparatus or recording/reproduction apparatus having compatible functions between existing DVDs and next-generation DVDs can be used common to those used upon using an existing DVD disk, and the processing routines and circuits of the reproduction apparatus or recording/reproduction apparatus having compatible functions between existing DVDs and next-generation DVDs can be simplified.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An information recording medium comprising:
    a management area where management information is recorded; and
    a plurality of physical sector areas used to record a plurality of physical sector data blocks, which are generated by combining some data contained in an ECC block containing a plurality of segmented blocks,
    wherein the ECC block as a source of the plurality of physical sector data blocks to be recorded in said plurality of physical sector areas is generated via a predetermined process, and
    the predetermined process generates the ECC block by:
        generating sector data which contains a data ID and is formed of a first number of bytes (172 bytes×12 rows);
        generating re-arranged sector data formed of 172 bytes×6 rows×2 by re-arranging data contained in the sector data to predetermined positions;
        generating a sector block formed of 172 bytes×6 rows× 2×32 by combining 32 of re-arranged sector data items;
        generating two segmented blocks formed of 172 bytes×6 rows×32 by dividing the sector block into two segmented blocks;
        generating outer-code parity data formed of 16 rows by encoding, in a column direction, data formed of 6 rows×32 which forms each of the segmented block;
        generating inner-code parity data by encoding, data in a row direction, data formed of 172 bytes which forms each segmented block and the generated outer-code parity data; and
        individually appending the generated outer- and inner-code parity data to each segmented block.

2. A medium according to claim 1, wherein each physical sector data block recorded on said physical sector area is formed of a set of data lines each of which is made up of a portion of the sector data and a portion of the inner-code parity data, and consists of a second number of bytes, and data lines each of which is made up of only a portion of the outer-code parity data and consists of the second number of bytes, and a total number of data lines of the set is an integer multiple of the number of segmented blocks.

3. A medium according to claim 1, wherein each physical sector data block recorded on said physical sector area contains the data ID, and has a data structure in which the data ID is arranged at a specific position.

4. A medium according to claim 1, wherein each physical sector data block recorded on said physical sector area contains the data ID, and has a data structure in which the data ID is arranged at a head position, and a data line made up of only a portion of the outer-code parity data is arranged as a final line.

5. A medium according to claim 1, wherein physical sector information which indicates the physical sector data block to be recorded on said physical sector area corresponds to logical sector information which indicates the sector data.

6. A medium according to claim 5, wherein an arrangement of at least some data of the ECC block as a source of the plurality of sector data blocks to be recorded on said plurality of physical sector areas corresponds to logical sector information.

7. An information recording apparatus for recording information on an information recording medium, comprising:
a generation section configured to generate an ECC block containing a plurality of segmented blocks; and
a recording section configured to generate a plurality of physical sector data blocks by combining some data contained in the ECC block, and to record the plurality of physical sector data blocks on a plurality of physical sector areas on the information recording medium,
wherein said generation section generates the ECC block by:
generating sector data which contains a data ID and is formed of a first number of bytes (172 bytes×12 rows);
generating re-arranged sector data formed of 172 bytes×6 rows×2 by re-arranging data contained in the sector data to predetermined positions;
generating a sector block formed of 172 bytes×6 rows× 2×32 by combining 32 of re-arranged sector data items;
generating two segmented blocks formed of 172 bytes×6 rows×32 by dividing the sector block into two segmented blocks;
generating outer-code parity data formed of 16 rows by encoding, in a column direction, data formed of 6 rows×32 which forms each of the segmented block;
generating inner-code parity data by encoding, data in a row direction, data formed of 172 bytes which forms each segmented block and the generated outer-code parity data; and
individually appending the generated outer- and inner-code parity data to each segmented block.

8. An apparatus according to claim 7, wherein said recording section alternately extracts data from different data lines in the physical sector data block, and records the extracted data in turn on the physical sector area.

9. An apparatus according to claim 7, wherein said recording section records the physical sector data block on the physical sector area with physical sector information that indicates the physical sector data block corresponding to logical sector information that indicates the sector data.

10. An apparatus according to claim 9, wherein said recording section records the physical sector data block on the physical sector area with an arrangement of at least some data of the ECC block corresponding to logical sector information.

11. An information reproduction apparatus for reproducing an information recording medium which comprises a plurality of physical sector areas on which a plurality of physical sector data blocks generated by combining some data contained in an ECC block containing a plurality of segmented blocks is recorded, comprising:
a read-out section configured to read out the plurality of physical sector data blocks from the plurality of physical sector areas on the information recording medium; and
a reproduction section configured to reproduce data by generating the ECC block from the plurality of readout physical sector data blocks,
wherein said reproduction section generates the ECC block via a predetermined process,
the predetermined process generates the ECC block by:
generating sector data which contains a data ID and is formed of a first number of bytes (172 bytes×12 rows);
generating re-arranged sector data formed of 172 bytes×6 rows×2 by re-arranging data contained in the sector data to predetermined positions;
generating a sector block formed of 172 bytes×6 rows× 2×32 by combining 32 of re-arranged sector data items;
generating two segmented blocks formed of 172 bytes×6 rows×32 by dividing the sector block into two segmented blocks;
generating outer-code parity data formed of 16 rows by encoding, in a column direction, data formed of 6 rows×32 which forms each of the segmented block;
generating inner-code parity data by encoding, data in a row direction, data formed of 172 bytes which forms each segmented block and the generated outer-code parity data; and
individually appending the generated outer- and inner-code parity data to each segmented block, and
said reproduction section reproduces the sector data by utilizing the predetermined process.

12. An apparatus according to claim 11, wherein the physical sector data block read out by said read-out section is formed of a set of data lines each of which is made up of a portion of the sector data and a portion of the inner-code parity data, and consists of a second number of bytes, and data lines each of which is made up of only a portion of the outer-code parity data and consists of the second number of bytes, and a total number of data lines of the set is an integer multiple of the number of the plurality of segmented blocks,
each physical sector data block recorded on said physical sector area contains the data ID, and has a data structure in which the data ID is arranged at a head position, and a data line made up of only a portion of the outer-code parity data is arranged as a final line, and
said reproduction section reproduces the data ID from the head position of each physical sector data block.

13. An apparatus according to claim 12, wherein the physical sector area read out by said read-out section records data alternately extracted from different data lines in the physical sector data block, and
said reproduction section reproduces the physical sector data block read out from the physical sector area under a condition that the data alternately extracted from the different data lines is recorded.

14. An information recording method for recording information on an information recording medium, comprising:
- generating an ECC block containing a plurality of segmented blocks; and
- generating a plurality of physical sector data blocks by combining some data contained in the ECC block, and recording the plurality of physical sector data blocks on a plurality of physical sector areas on the information recording medium,
- wherein generating the ECC block comprises:
  - generating sector data which contains a data ID and is formed of a first number of bytes (172 bytes×12 rows);
  - generating re-arranged sector data formed of 172 bytes×6 rows×2 by re-arranging data contained in the sector data to predetermined positions;
  - generating a sector block formed of 172 bytes×6 rows× 2×32 by combining 32 of re-arranged sector data items;
  - generating two segmented blocks formed of 172 bytes×6 rows×32 by dividing the sector block into two segmented blocks;
  - generating outer-code parity data formed of 16 rows by encoding, in a column direction, data formed of 6 rows×32 which forms each of the segmented block;
  - generating inner-code parity data by encoding, data in a row direction, data formed of 172 bytes which forms each segmented block and the generated outer-code parity data; and
  - individually appending the generated outer- and inner-code parity data to each segmented block.

15. A method according to claim 14, further comprising alternately extracting data from different data lines in the physical sector data block, and recording the extracted data in turn on the physical sector area.

16. A method according to claim 14, further comprising recording the physical sector data block on the physical sector area with physical sector information that indicates the physical sector data block corresponding to logical sector information that indicates the sector data.

17. A method according to claim 16, further comprising recording the physical sector data block on the physical sector area with an arrangement of at least some data of the ECC block corresponding to logical sector information.

18. An information reproduction method for reproducing information from an information recording medium which comprises a plurality of physical sector areas on which a plurality of physical sector data blocks generated by combining some data contained in an ECC block containing a plurality of segmented blocks is recorded, the method comprising:
- reading out the plurality of physical sector data blocks from the plurality of physical sector areas on the information recording medium; and
- reproducing data by generating the ECC block from the plurality of readout physical sector data blocks,
- wherein the ECC block is generated via a predetermined process, the predetermined process including:
  - generating sector data which contains a data ID and is formed of a first number of bytes (172 bytes×12 rows);
  - generating re-arranged sector data formed of 172 bytes×6 rows×2 by re-arranging data contained in the sector data to predetermined positions;
  - generating a sector block formed of 172 bytes×6 rows× 2×32 by combining 32 of re-arranged sector data items;
  - generating two segmented blocks formed of 172 bytes×6 rows×32 by dividing the sector block into two segmented blocks;
  - generating outer-code parity data formed of 16 rows by encoding, in a column direction, data formed of 6 rows×32 which forms each of the segmented block;
  - generating inner-code parity data by encoding, data in a row direction, data formed of 172 bytes which forms each segmented block and the generated outer-code parity data;
  - individually appending the generated outer- and inner-code parity data to each segmented block; and
  - reproducing the sector data by utilizing the predetermined process.

19. A method according to claim 18, wherein each of the read out plurality of physical sector data blocks is formed of a set of data lines each of which is made up of a portion of the sector data and a portion of the inner-code parity data, and consists of a second number of bytes, and data lines each of which is made up of only a portion of the outer-code parity data and consists of the second number of bytes, and a total number of data lines of the set is an integer multiple of the number of segmented blocks,
- each physical sector data block recorded on said physical sector area contains the data ID, and has a data structure in which the data ID is arranged at a head position, and a data line made up of only a portion of the outer-code parity data is arranged as a final line, and
- the method further comprising reproducing the data ID from the head position of each physical sector data block.

20. A method according to claim 19, wherein the physical sector area records data alternately extracted from different data lines in the physical sector data block, the method further comprising:
- reproducing the physical sector data block read out from the physical sector area under a condition that the data alternately extracted from the different data lines is recorded.

* * * * *